United States Patent
Toi et al.

(10) Patent No.: US 7,120,903 B2
(45) Date of Patent: Oct. 10, 2006

(54) DATA PROCESSING APPARATUS AND METHOD FOR GENERATING THE DATA OF AN OBJECT PROGRAM FOR A PARALLEL OPERATION APPARATUS

(75) Inventors: Takao Toi, Minato-ku (JP); Toru Awashima, Minato-ku (JP); Yoshiyuki Miyazawa, Kawasaki (JP); Noritsugu Nakamura, Minato-ku (JP); Taro Fujii, Minato-ku (JP); Koichiro Furuta, Minato-ku (JP); Masato Motomura, Minato-ku (JP)

(73) Assignee: NEC Corporation, Tokyo (JP)

( * ) Notice: Subject to any disclaimer, the term of this patent is extended or adjusted under 35 U.S.C. 154(b) by 704 days.

(21) Appl. No.: 10/252,564

(22) Filed: Sep. 24, 2002

(65) Prior Publication Data

US 2003/0061601 A1    Mar. 27, 2003

(30) Foreign Application Priority Data

Sep. 26, 2001    (JP) .............................. 2001-294241

(51) Int. Cl.
*G06F 9/45* (2006.01)
*G06F 15/00* (2006.01)
*G06F 7/38* (2006.01)
*G06F 15/76* (2006.01)
*G06F 9/46* (2006.01)

(52) U.S. Cl. ...................... 717/149; 717/144; 717/156; 712/32; 712/229; 712/245; 712/10; 718/102; 718/108

(58) Field of Classification Search ..................... None
See application file for complete search history.

(56) References Cited

U.S. PATENT DOCUMENTS

| | | | |
|---|---|---|---|
| 3,702,986 A * | 11/1972 | Taylor et al. | 712/25 |
| 4,943,912 A * | 7/1990 | Aoyama et al. | 712/16 |
| 5,193,202 A * | 3/1993 | Jackson et al. | 718/100 |
| 5,390,336 A * | 2/1995 | Hillis | 712/22 |
| 5,410,727 A * | 4/1995 | Jaffe et al. | 709/234 |
| 5,915,123 A * | 6/1999 | Mirsky et al. | 712/16 |
| 6,145,072 A * | 11/2000 | Shams et al. | 712/22 |
| 6,216,252 B1 * | 4/2001 | Dangelo et al. | 716/1 |

(Continued)

FOREIGN PATENT DOCUMENTS

JP    8-101861    4/1996

(Continued)

OTHER PUBLICATIONS

1. Lawrence Snyder, "Introduction to the Configurable Highly Parallel Computer", *IEEE Computer*, vol. 15, No. 1, Jan. 1982, pp. 47-56.

*Primary Examiner*—Antony Nguyen-Ba
(74) *Attorney, Agent, or Firm*—Sughrue Mion, PLLC

(57) ABSTRACT

An object code for sequentially switching contexts of processing circuits arrayed in a matrix in a parallel operation apparatus is generated from a general source code descriptive of operation of the parallel operation apparatus. A Data Flow Graph (DFG) is generated from the source code descriptive of operation of the parallel operation apparatus according to limiting conditions, registered in advance, representing a physical structure, etc. of the parallel operation apparatus, and scheduled in a Control Data Flow Graph (CDFG). An Register Transfer Level (RTL) description is generated from the CDFG, converting a finite-state machine into an object code and converting a data path into a net list. An object code of the processing circuits is generated in each context from the net list.

59 Claims, 15 Drawing Sheets

U.S. PATENT DOCUMENTS

| | | | |
|---|---|---|---|
| 6,281,703 B1* | 8/2001 | Furuta et al. | 326/40 |
| 6,339,341 B1* | 1/2002 | Fujii et al. | 326/38 |
| 6,356,109 B1* | 3/2002 | Furuta et al. | 326/41 |
| 6,424,171 B1* | 7/2002 | Motomura et al. | 326/41 |
| 2003/0046513 A1* | 3/2003 | Furuta et al. | 712/15 |
| 2003/0061601 A1* | 3/2003 | Toi et al. | 717/144 |

FOREIGN PATENT DOCUMENTS

| | | |
|---|---|---|
| JP | 10-256383 | 9/1998 |
| JP | 2000-138579 A | 5/2000 |
| JP | 2000-224025 A | 8/2000 |
| JP | 2000-232162 A | 8/2000 |
| JP | 2000-232354 A | 8/2000 |
| JP | 2001-236385 A | 8/2001 |
| JP | 2003-76668 | 3/2003 |
| JP | 2003-518666 | 6/2003 |

\* cited by examiner

FIG. 6A
CDFG
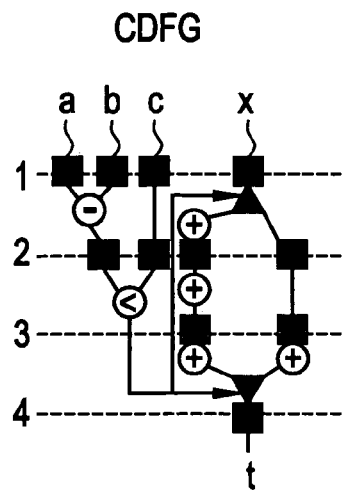
FIG. 6B
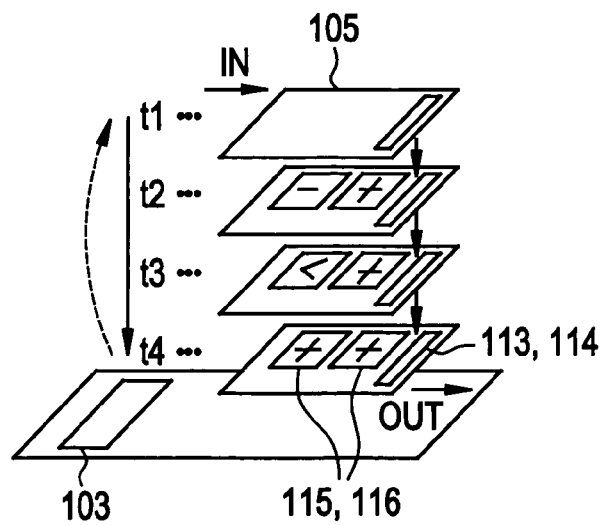
FIG. 7
X = A + B;
E = X - D;
F = B + C - X;
FIG. 8
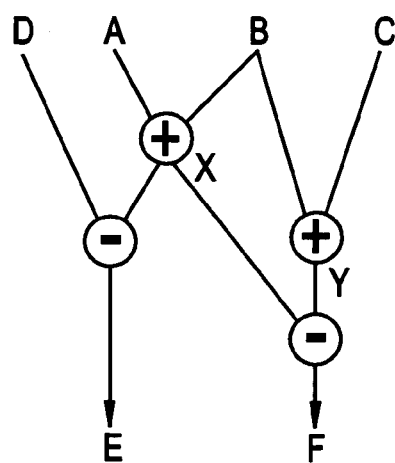

FIG. 9A
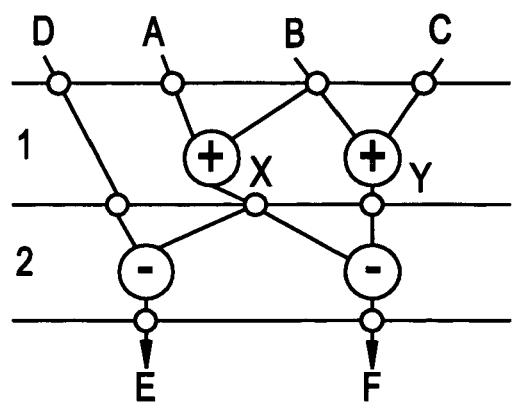
FIG. 9B
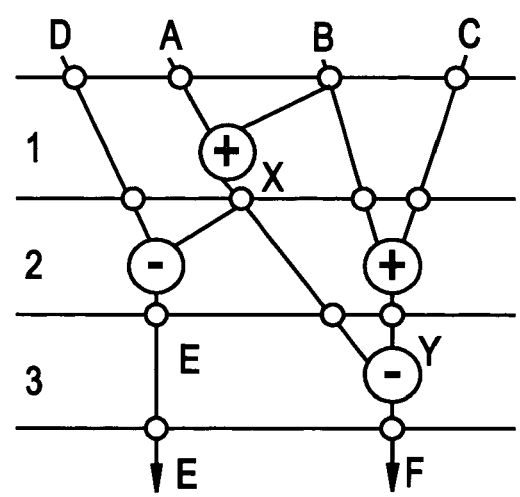
FIG. 10
A = in - Port;
X = (A + B) *C*D;
A = in - Port;
Y = A + D;
Z = X*Y;

DATA PROCESSING APPARATUS AND METHOD FOR GENERATING THE DATA OF AN OBJECT PROGRAM FOR A PARALLEL OPERATION APPARATUS

BACKGROUND OF THE INVENTION

1. Field of the Invention

The present invention relates to a data processing apparatus and method for generating the data of an object program for a parallel operation apparatus, a computer program for the data processing apparatus, an information storage medium storing the data of the computer program, a parallel operation apparatus operable according to the object program, and a data processing system which comprises the parallel operation apparatus and the data processing apparatus.

2. Description of the Related Art

Products called CPU (Central Processing Unit) and MPU (Micro-Processor Unit) are used in the art as processor units capable of freely performing various data processing processes.

In a data processing system using such a processor unit, various object codes descriptive of a plurality of operation instructions and various processing data are stored in a memory device, and the processing unit sequentially reads operation instructions and processing data from the memory device and successively executes a plurality of data processing processes.

While one processor unit is capable of performing various data processing processes, since the processor unit needs to carry out the processing processes successively in sequence, and also need to read operation instructions from the memory device for the respective processing processes, it is difficult for the processor unit to execute complex processing processes at a high speed.

If there is only one data processing process to be carried out and if a logic circuit for carrying out the data processing process is hardware-implemented, then a processor unit would not be required to read a plurality of operation instructions sequentially from a memory device and execute a plurality of data processing processes successively in sequence. Therefore, a complex data processing process can be performed at a high speed, though only one data processing process can be executed.

Stated otherwise, a data processing system wherein object codes are freely changeable is capable of performing various data processing processes, but finds it difficult to carry out data processing processes at a high speed because it has a fixed hardware arrangement. On the other hand, a hardware-implemented logic circuit can carry out a data processing process at a high speed, but can execute only one data processing process as no object code can be changed.

To solve the above problem, the present applicant has devised, and filed a patent application on, a parallel operation apparatus as a processor unit whose hardware arrangement changes depending on software. The parallel operation apparatus has been disclosed in Japanese laid-open patent publication No. 2001-236385. The disclosed parallel operation apparatus has a matrix of many small-scale processing circuits and interconnection circuits and a state manager connected parallel to the matrix.

The processing circuits perform respective data processing processes individually according to operation instructions based on individual data settings, and the interconnection circuits individually control connections between the processing circuits according to operation instructions based on individual data settings. The parallel operation apparatus can perform various data processing processes because it changes the hardware arrangement by changing operation instructions for the processing circuits and the interconnection circuits, and can execute data processing processes at a high speed because the many small-scale processing circuits as hardware circuits perform simple data processing processes parallel to each other.

Since the state manager successively switches contexts made up of operation instructions for the processing circuits and the interconnection circuits in respective operation cycles according to object codes, the parallel operation apparatus can parallel processing processes consecutively according to the object codes.

Parallel operation apparatus in which contexts are successively switched in a plurality of cycles are disclosed in "Introduction to the Configurable, Highly Parallel Computer" published by Lawrence Snyder of Purdue University in IEEE Computer, vol. 15, No. 1, January 1982, pp. 47–56, Japanese laid-open patent publications Nos. 2000-138579, 2000-224025, 2000-232354, and 2000-232162 based on patent applications filed by the present applicant.

In the above parallel operation apparatus, since a state manager switches contexts contained in object codes successively in respective operation cycles, a plurality of processing circuits and a plurality of interconnection circuits which are connected in a matrix operate parallel to each other in the operation cycles according to the contexts.

However, the above parallel operation apparatus are basically different from conventional CPUs as to both structure and operation. Therefore, the parallel operation apparatus are unable to simply generate object codes from source codes according to a conventional method. There has been no technique available in the art so far for generating object codes from source codes for the above parallel operation apparatus.

SUMMARY OF THE INVENTION

It is therefore an object of the present invention to provide a data processing apparatus and method for generating the data of an object program for a parallel operation apparatus which successively switches contexts, a computer program for the data processing apparatus, an information storage medium storing the data of the computer program, a parallel operation apparatus operable according to the object program, and a data processing system which comprises the parallel operation apparatus and the data processing apparatus.

A data processing apparatus according to an aspect of the present invention has a source input means, a condition storage means, an object generating means, and an object output means, and generates an object code from a source code descriptive of operation of a parallel operation apparatus. The parallel operation apparatus has a matrix of processing circuits and interconnection circuits. The processing circuits individually carry out data processing according to individually established operation instructions, and the interconnection circuits individually switch connections between the processing circuits according to individually established operation instructions. In the parallel operation apparatus, contexts made up of operation instructions for the processing circuits and the interconnection circuits are switched in respective operation cycles. An object code for switching the contexts is generated from a source code by the data processing apparatus according to the present invention.

In the data processing apparatus, the condition storage means registers, in advance, limiting conditions representing at least a physical structure and physical characteristics of the parallel operation apparatus. The source code descriptive of operation of the parallel operation apparatus is entered by the source input means. The object generating means generates an object code for sequentially switching contexts of the parallel operation apparatus from the entered source code according to the limiting conditions. The object output means outputs the object code generated by the object generating means. In this manner, the object code for sequentially switching contexts of the parallel operation apparatus is generated from the source code descriptive of operation of the parallel operation apparatus.

According to another aspect of the present invention, a parallel operation apparatus has a matrix circuit and a state manager which are separate from each other. Contexts of the matrix circuit which comprises a matrix of processing circuits and interconnection circuits are sequentially switched in operation cycles by the state manager. A data processing apparatus according to the other aspect of the present invention generates an object code of the parallel operation apparatus. In the data processing apparatus, when an object generating means generates an object code from a source code according to limiting conditions, a data path corresponding to the matrix circuit and a finite-state machine corresponding to the state manager are separated from each other, and an object code is generated separately for the matrix circuit and the state manager of the parallel operation apparatus.

The object generating means comprises a graph generating means and a schedule generating means. The graph generating means analyzes the language of the source code and generates a DFG (Data Flow Graph). The schedule generating means generates a CDFG (Control DFG) in which the operation states in a plurality of stages are scheduled, from the generated DFG according to the limiting conditions. Thus, the CDFG in which the sequentially transited operation states in a plurality of stages are scheduled is generated from the source code descriptive of operation of the parallel operation apparatus.

The schedule generating means generates the CDFG in order for the state manager to update the context for which a corresponding process has been executed into a new context while the matrix circuit is performing the corresponding process in one of the predetermined number of contexts stored in the matrix circuit.

Therefore, in the parallel operation apparatus which operates according to the object code generated from the CDFG, the matrix circuit stores the contexts of the object code up to a predetermined number and sequentially performs corresponding processes, and the state manager updates the context for which a corresponding process has been executed into a new context while the matrix circuit is performing the corresponding process in one of the predetermined number of contexts stored in the matrix circuit;

A description generating means generates an RTL (Register Transfer Level) description in the operation states in a plurality of stages, separately for the matrix circuit and the state manager, from the CDFG generated by the schedule generating means according to the limiting conditions.

Consequently, the RTL description of the parallel operation apparatus is generated separately for the matrix circuit and the state manager.

A list generating means generates net lists of the processing circuits in the respective operation states in a plurality of stages from the RTL description of the matrix circuit generated by the description generating means according to the limiting conditions.

Consequently, the net lists of the processing circuits of the parallel operation apparatus are generated in the respective sequentially transited operation states in a plurality of stages.

According to still another aspect of the present invention, a parallel operation apparatus has a matrix of processing circuits each having a plurality of types of circuit resources for which processing data have different bit numbers. A data processing apparatus has a list generating means for generating net lists of the plurality of types of circuit resources from an RTL description of the matrix circuit which has been generated by a description generating means according to limiting conditions.

Consequently, the net lists of the processing circuits of the parallel operation apparatus are generated for the respective types of circuit resources having different bit numbers.

An object storage means registers, in advance, various object codes of the state manager which correspond to the operation states in a plurality of stages. A state converting means converts the RTL description of the state manager generated by the description generating means into the corresponding object codes according to the net lists of the matrix circuit which have been generated by the list generating means. An object output means outputs the object codes of the state manager which have been converted by the state converting means.

Consequently, the object codes of the state manager are generated according to the net lists of the matrix circuit.

Each of the processing circuits of the parallel operation apparatus comprises mb circuit resources for which processing data comprises mb data and nb circuit resources for which processing data comprises nb data. The list generating means generates net lists of m/nb circuit resources of the processing circuits from the RTL description according to the limiting conditions.

Consequently, the net lists of the processing circuits of the parallel operation apparatus are generated for the respective m/nb circuit resources.

The list generating means assigns "xb" data processing of the RTL description to Y mb circuit resources and Z nb circuit resources where x=Ym+Zn.

Consequently, appropriate numbers of "xb" data processing processes are assigned to the m/nb circuit resources.

The list generating means calculates an integer "Y" of the result produced by dividing "x" by "m", and calculating an integer "Z" of the result produced by dividing the remainder by "n".

Consequently, the "xb" data processing processes are maximally assigned to the mb circuit resources whose bit number is large, and only the remainder is assigned to nb circuit resources whose bit number is small.

The list generating means calculates the integer "Z" if the remainder is smaller than a predetermined threshold, and adds "1", to "Y" to make "Z=0" if the remainder is equal to or greater than the predetermined threshold.

Consequently, the remainder of "xb" data processing processes maximally assigned to the mb circuit resources can be assigned to an appropriate one of the m/n circuit resources depending on the bit number.

Because "nb" of the limiting conditions registered in the condition storage means comprises "1 (bit)", the remainder of the "xb" data processing processes assigned to the mb circuit resources can be assigned to the nb circuit resources irrespective of the bit number of the remainder.

According to yet another aspect of the present invention, an object storage means registers, in advance, various object codes of processing circuits. A processing layout means assigns net lists generated by a list generating means to the processing circuits of the matrix circuit in respective contexts in a plurality of cycles. A code converting means converts the net lists assigned to the processing circuits into corresponding object codes.

Therefore, the object codes of the processing circuits of the parallel operation apparatus are generated in the respective contexts in a plurality of cycles.

The object storage means registers, in advance, various object codes of interconnection circuits. An interconnection converting means converts the net lists of the interconnection circuits into object codes according to the object codes of the processing circuits which have been converted by the code converting means.

Consequently, the object codes of the interconnection circuits for individually controlling connections between the processing circuits of the parallel operation apparatus are generated.

Each of the processing circuits has a register file for temporarily holding processing data. The data processing apparatus has a processing layout means for commonly assigning net lists associated with processing data in the contexts in a plurality of successive cycles to the register files in a given position in the matrix circuit.

Consequently, object codes for enabling the register files in a given position to temporarily hold the processing data associated in the contexts in a plurality of successive cycles of the parallel operation apparatus are generated.

The processing layout means first assigns the net lists to the register files irrespective of the association of the processing data in the respective contexts in a plurality of cycles, and then adjusts assigned positions to align the positions of the register files to which the net lists associated with the processing data are assigned, in the contexts in a plurality of respective cycles.

Alternatively, the processing layout means first fixes the positions in the matrix circuit of the register files to which the net lists associated with the processing data are commonly assigned in the contexts in a plurality of cycles, and then assigns other net lists to other register files in the respective contexts in a plurality of cycles.

Further alternatively, the processing layout means first sets the relative positions in the matrix circuit of the register files to which the net lists associated with the processing data are commonly assigned in the contexts in a plurality of cycles, and then assigns other net lists to other register files in the respective contexts in a plurality of cycles while maintaining the relative positions.

Consequently, object codes for temporarily holding associated processing data in the register files in a given position are generated according to a given data processing process.

A state detecting means detects a plurality of operation states to be assigned to one of the contexts from the operation states in a plurality of successively transited stages according to the limiting conditions, and a state combining means assigns the detected operation states to one of the contexts.

Consequently, a plurality of operation states are set as one context in the parallel operation apparatus at one time.

The state detecting means detects a plurality of operation states in successive transition stages.

Therefore, a plurality of successive operation states are set as one context in the parallel operation apparatus.

A first parallel operation apparatus according to the present invention has a matrix of processing circuits operable parallel to each other for data processing that can individually be established. Contexts of the processing circuits are sequentially switched in respective operation cycles according to object codes stored in a code storage means, the object code being generated by a data processing apparatus according to the present invention.

Therefore, contexts in a plurality of cycles are sequentially switched according to the stored object codes.

A second parallel operation apparatus according to the present invention has a matrix of processing circuits operable parallel to each other for data processing that can individually be established. Contexts of the processing circuits are sequentially switched in respective operation cycles according to object codes entered by an object input means. When object codes generated by a data processing apparatus according to the present invention are entered from an external source into the object input means, contexts in a plurality of cycles are sequentially switched according to the entered object codes.

In a first data processing system according to the present invention, when a parallel operation apparatus is supplied with an object code generated by a data processing apparatus, the parallel operation apparatus carries out parallel arithmetic processes in contexts in a plurality of cycles that are sequentially switched.

In a second data processing system according to the present invention, a parallel operation apparatus has a matrix circuit and a state manager which are separate from each other. A data processing apparatus generates an object code separately for a data path and a finite-state machine from a source code. The data path and the matrix circuit correspond to each other, and the finite-state machine and the state manager correspond to each other.

Consequently, the data processing apparatus generates an object code having a software structure corresponding to the hardware structure of the parallel operation apparatus.

The various means according to the present invention may be constructed in a manner to perform their functions, and may comprise a dedicated piece of hardware for performing the functions, a data processing apparatus having the functions that can be achieved by a computer program, desired functions provided in a data processing apparatus by a computer program, or a combination thereof. The various means according to the present invention are not required to be independent of each other, and some of the various means may be part of other means.

An information storage medium referred to in the present invention may be a piece of hardware storing, in advance, a computer program for enabling a data processing apparatus to perform various processes. For example, the information storage medium may be a ROM (Read Only Memory) or a HDD (Hard Disc Drive) fixedly incorporated in an apparatus which includes the data processing apparatus as part thereof, or a CD (Compact Disc)-ROM or an FD (Floppy Disc) replaceably loaded in an apparatus which includes the data processing apparatus as part thereof.

The data processing apparatus referred to in the present invention may be a piece of hardware for reading a computer program and performing corresponding data processing processes. For example, the data processing apparatus may comprise a hardware arrangement including a CPU (Central Processing Unit) as a main unit, and various devices including a ROM, a RAM (Random Access Memory), an I/F (InterFace) unit, etc. which are connected to the CPU.

According to the present invention, enabling a data processing apparatus to carry out various processes according to a computer program covers enabling a data processing apparatus to control operation of various devices. For example, saving various data in a data processing apparatus covers storing various data in an information storage medium as part of the data processing apparatus or storing various data in an information storage medium such as an FD or the like which is replaceably loaded in the data processing apparatus.

The above and other objects, features, and advantages of the present invention will become apparent from the following description with reference to the accompanying drawings which illustrate examples of the present invention.

BRIEF DESCRIPTION OF THE DRAWINGS

FIGS. 6A and 6B are schematic views showing the associative relationship between state transitions of a CDFG and context switchings of the array-type processor;

FIG. 7 is a diagram showing a specific example of a source code;

FIG. 8 is a diagram showing a specific example of a DFG;

FIG. 9A is a diagram showing a specific example of a CDFG of the array-type processor according to the present invention;

FIG. 9B is a diagram showing a specific example of a CDFG of a conventional array-type processor;

FIG. 10 is a diagram showing a specific example of another source code;

DETAILED DESCRIPTION OF THE PREFERRED EMBODIMENTS

Figure 4:
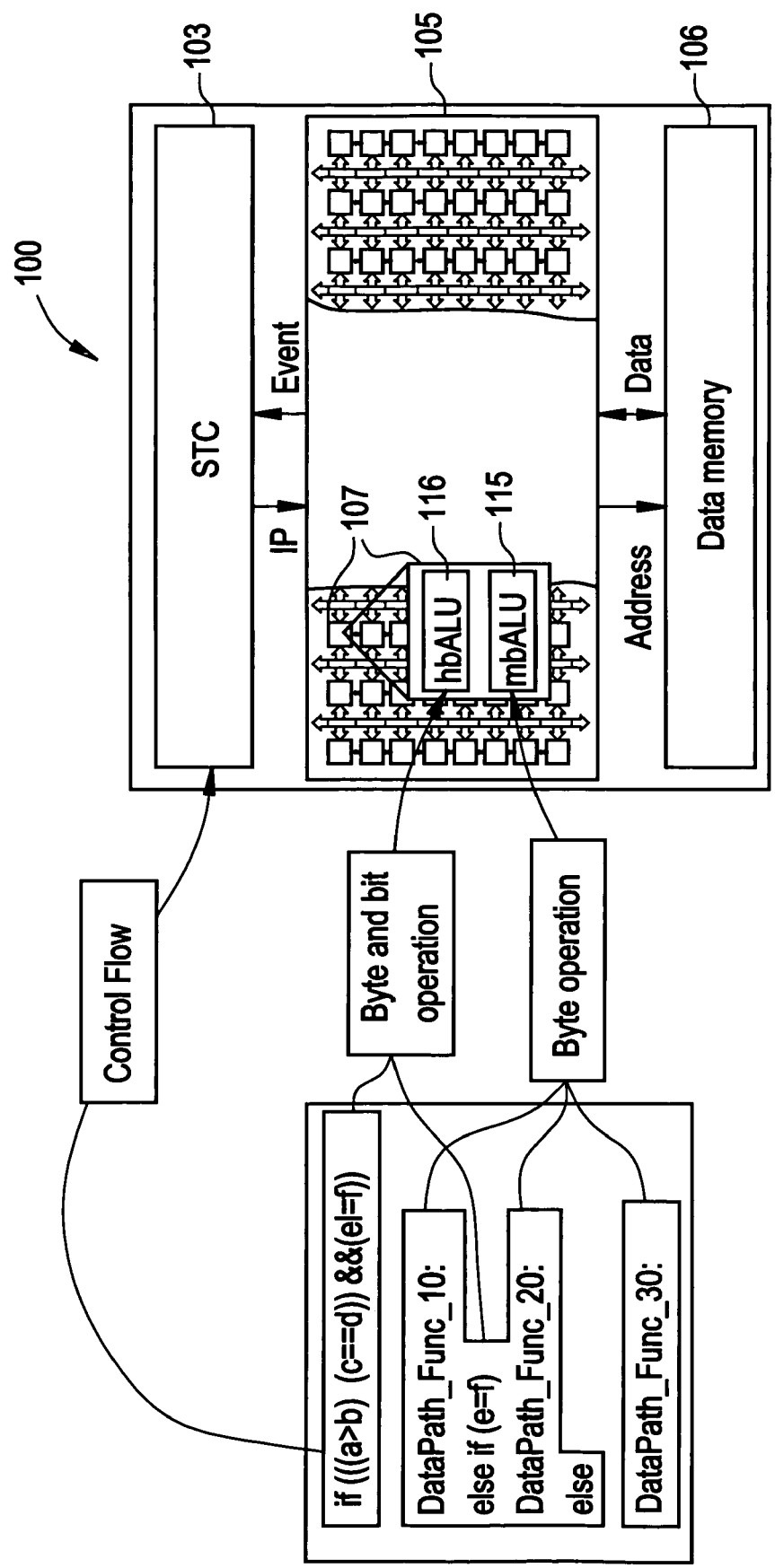
FIG. 4 is a schematic view showing the associative relationship between descriptions of source codes and hardware details of an array-type processor as a parallel operation apparatus.
Figure 5A:
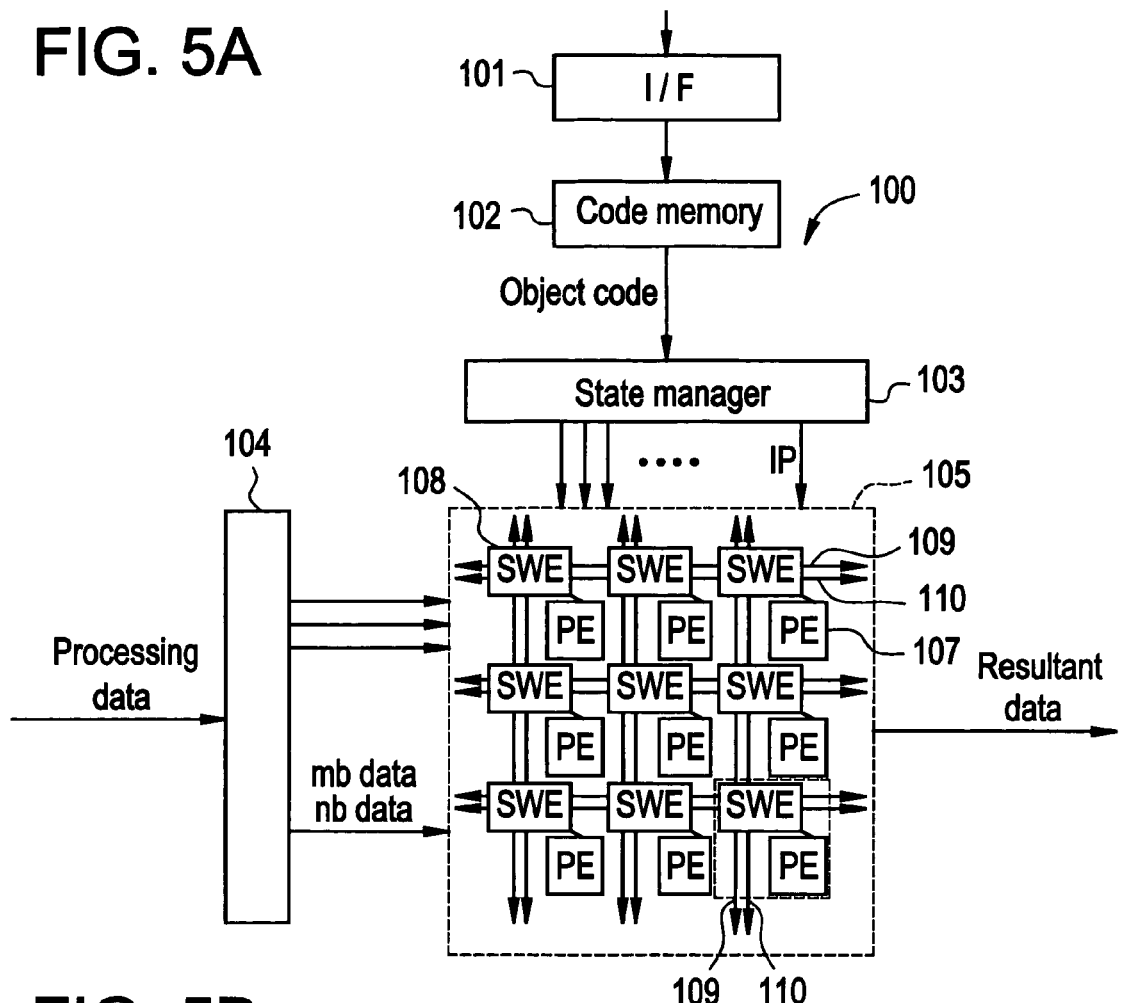
FIG. 5A is a block diagram showing an overall structure of the array-type processor.

As shown in FIGS. 4 and 5A, an array-type processor 100 as a parallel operation apparatus according to an embodiment of the present invention comprises an I/F unit 101 serving as an object input means, a code memory 102 serving as a code storage means, a state manager 103, a data distributor 104, a matrix circuit 105, and a data memory 106. The matrix circuit 105 comprises a matrix of processor elements 107 serving as a plurality of processing circuits, switch elements 108 serving as a plurality of interconnection circuits, a number of mb buses 109, and a number of nb buses 110.

Figure 5B:
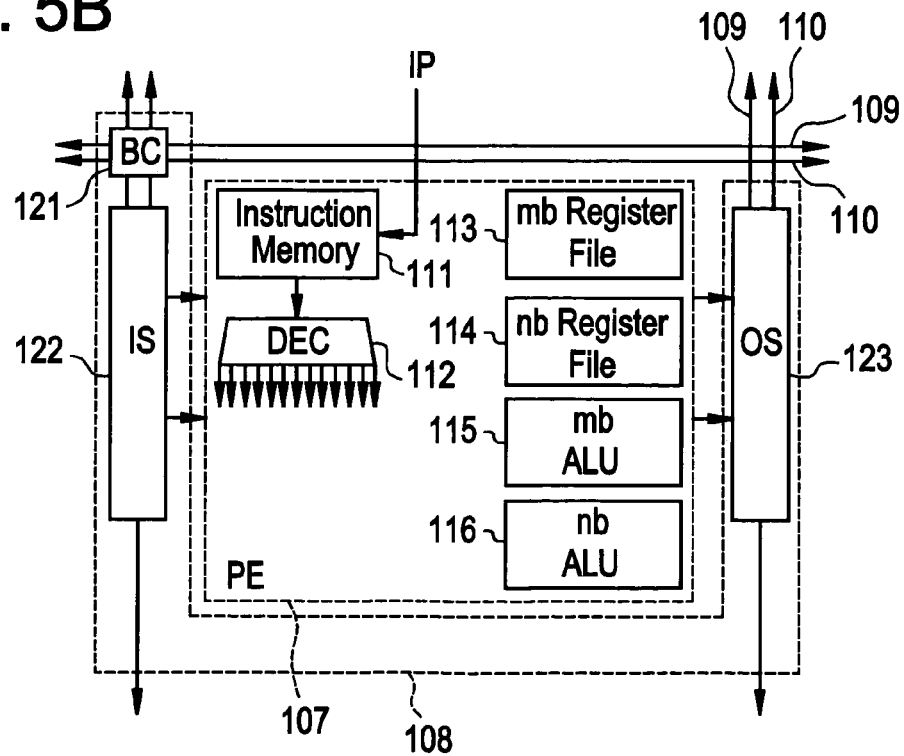
FIG. 5B is a block diagram showing an internal structure of a processor element as a processing circuit.

As shown in FIG. 5B, each of the processor elements 107 comprises an instruction memory 111, an instruction decoder 112, an mb register file 113 serving as an mb circuit resource, an nb register file 114 serving as an nb circuit resource, an mb ALU 115 serving as an mb circuit resource and an mb arithmetic logic unit, an mb ALU 116 serving as an nb circuit resource and an nb arithmetic logic unit, and an internal interconnection resource 117. Each of the switch elements 108 has a bus connector 121, an input control circuit 122, and an output control circuit 123.

The I/F unit 101 is connected to a data processing apparatus 300 to be described later on. The data processing apparatus 300 supplies a series of object codes to the I/F unit 101. The code memory 102 comprises an information storage medium such as a RAM or the like, and stores object codes supplied from the data processing apparatus 300 via the I/F unit 101.

The object codes have data settings representing operation instructions for the processor elements 107 and the switch elements 108 arrayed in the matrix circuit 105, as contexts in respective operation cycles that are changed sequentially, and data settings representing operation instructions for the state manager 103 which switches the contexts in the respective operation cycles, as operation states which transit sequentially, as described in detail later on.

The state manager 103 reads contexts in respective operation cycles from object codes stored in the code memory 102, and generates instruction pointers for the processor elements 107 and the switch elements 108 from the operation instructions of the contexts.

In the present embodiment, the switch element 108 has an instruction memory, and the instruction memory 111 of the processor element 107 adjacent to the switch element 108 doubles as the instruction memory of the switch element 108. The state manager 103 supplies a set of generated instruction pointers for the processor element 107 and the switch element 108 to the instruction memory 111 of the processor element 107.

The instruction memory 111 stores, in advance, a plurality of operation instructions for the processor element 107 and the switch element 108. Operation instructions for the processor element 107 and the switch element 108 are specified by two instruction pointers supplied from the state manager 103. The instruction decoder 112 decodes operation instructions specified by instruction pointers, and controls the switch element 108, the internal interconnection resource 117, the m/nb ALUs 115, 116, etc.

The mb buses 109 transmit mb data as "8-(bit)" processing data, and the nb buses 110 transmit nb data as "1-(bit)" processing data. Therefore, the switching element 108 controls connections between plural processor elements 107 through the m/nb buses 109, 110 according to an operation control process of the instruction decoder 112.

More specifically, the mb buses 109 and the nb buses 110 extending in four directions are connected to the bus connector 121 of the switch element 108. The bus connector 121 controls mutual connections between the mb buses 109 thus connected to the connector 121 and the nb buses 110 thus connected to the connector 121.

In response to object codes stored in the code memory 102, the state manager 103 sequentially switches contexts of the matrix circuit 105 in respective operation cycles, and the processor elements 107 operate parallel to each other for data instructions for the processor element 107 and the switch element 108 are specified by two instruction pointers supplied from the state manager 103. The instruction decoder 112 decodes operation instructions specified by instruction pointers, and controls the switch element 108, the internal interconnection resource 117, the m/nb ALUs 115, 116, etc.

The mb buses 109 transmit mb data as "8-(bit)" processing data, and the nb buses 110 transmit nb data as "1-(bit)" processing data. Therefore, the switching element 108 controls connections between plural processor elements 107 through the m/nb buses 109, 110 according to an operation control process of the instruction decoder 112.

More specifically, the mb buses 109 and the nb buses 110 extending in four directions are connected to the bus connector 121 of the switch element 108. The bus connector 121 controls mutual connections between the mb buses 109 thus connected to the connector 121 and the nb buses 110 thus connected to the connector 121.

In response to object codes stored in the code memory 102, the state manager 103 sequentially switches contexts of the matrix circuit 105 in respective operation cycles, and the processor elements 107 operate parallel to each other for data processing processes which can individually be set in each of the switched stages of the contexts of the matrix circuit 105.

In the illustrated embodiment, the various components of the matrix circuit 105 are arrayed in one plane. However, the m/nb buses 109, 110, the switch elements 108, and the processor elements 107 may be superposed in a multilayer structure in actual applications.

The input control circuit 122 controls the input of data from the mb buses 109 to the mb register file 113 and the mb ALU 115, and the input of data from the nb buses 110 to the nb register file 114 and the nb ALU 116. The output control circuit 123 controls the output of data from the mb register file 113 and the mb ALU 115 to the mb buses 109, and the output of data from the nb register file 114 and the nb ALU 116 to the nb buses 110.

The data distributor 104 divides a series of processing data supplied from an,external device into mb data and nb data, and enters these m/nb data from the m/nb buses 109, 110 whose connections are controlled by the switch elements 108 to certain ones of the processor elements 107.

The internal interconnection resource 117 in the processor element 107 controls a connection between the mb register file 113 and the mb ALU 115 and a connection between the nb register file 114 and the nb ALU 116 within the processor element 107 according to an operation control process of the instruction decoder 112.

The mb register file 113 temporarily stores mb data entered from the mb buses 109 and outputs the stored mb data to the mb ALU 115 according to connections controlled by the internal interconnection resource 117. The nb register file 114 temporarily stores nb data entered from the nb buses 110 and outputs the stored nb data to the nb ALU 116 according to connections controlled by the internal interconnection resource 117.

The mb ALU 115 processes mb data according to an operation control process of the instruction decoder 112, and the mb ALU 115 processes nb data according to an operation control process of the instruction decoder 112. The processor element 107 reads m/nb data from and writes m/nb data in the m/nb registers 113, 114, and also reads processing data from and writes processing data in the data memory 106, if necessary.

Figure 1:
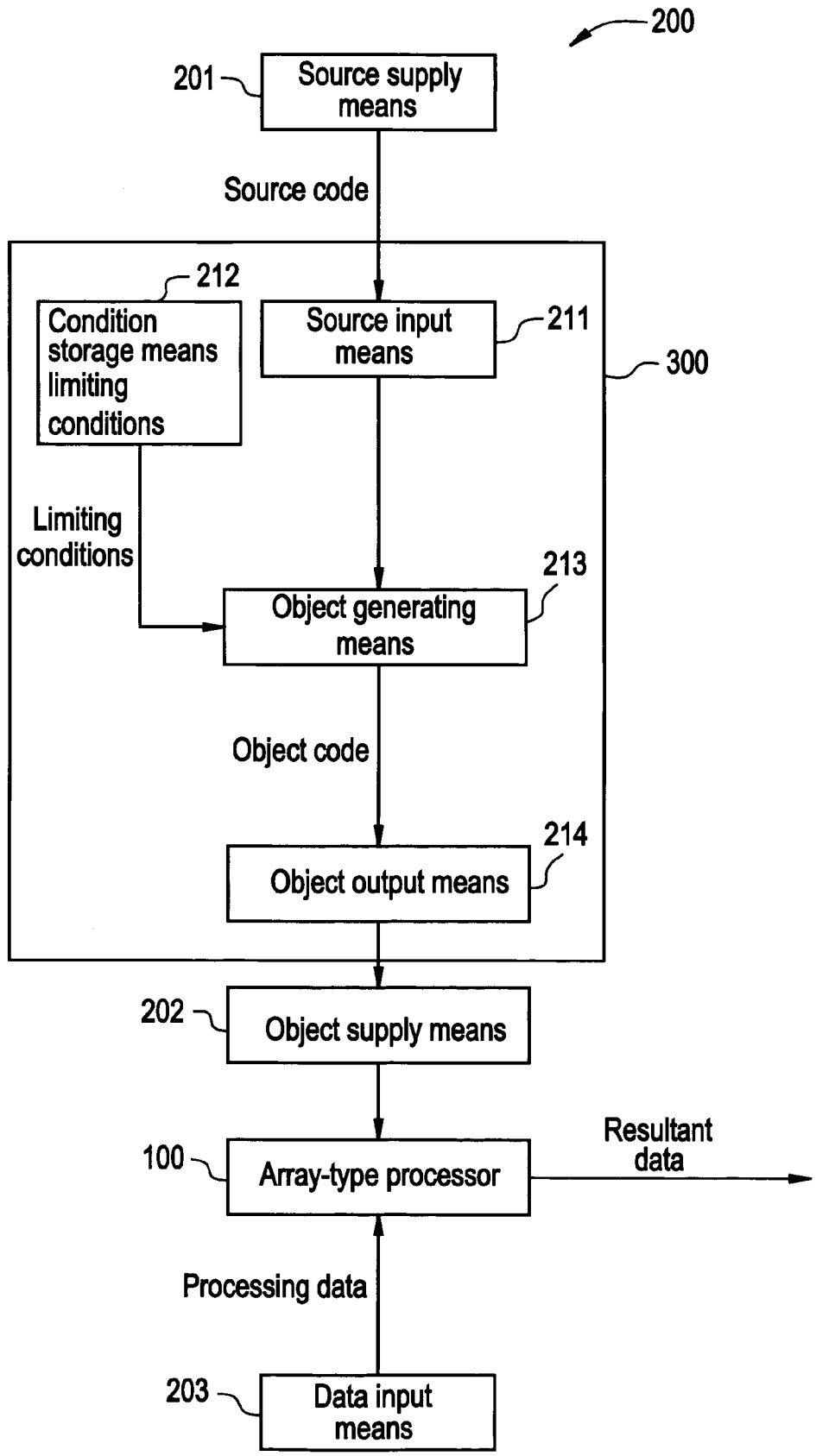
FIG. 1 is a block diagram showing a logical structure of a data processing system according to an embodiment of the present invention.

As shown in FIG. 1, a data processing system 200 which includes the array-type processor 100 as part thereof comprises the array-type processor 100, a data processing apparatus 300, a source supply means 201, an object supply means 202, and a data input means 203.

Figure 3:
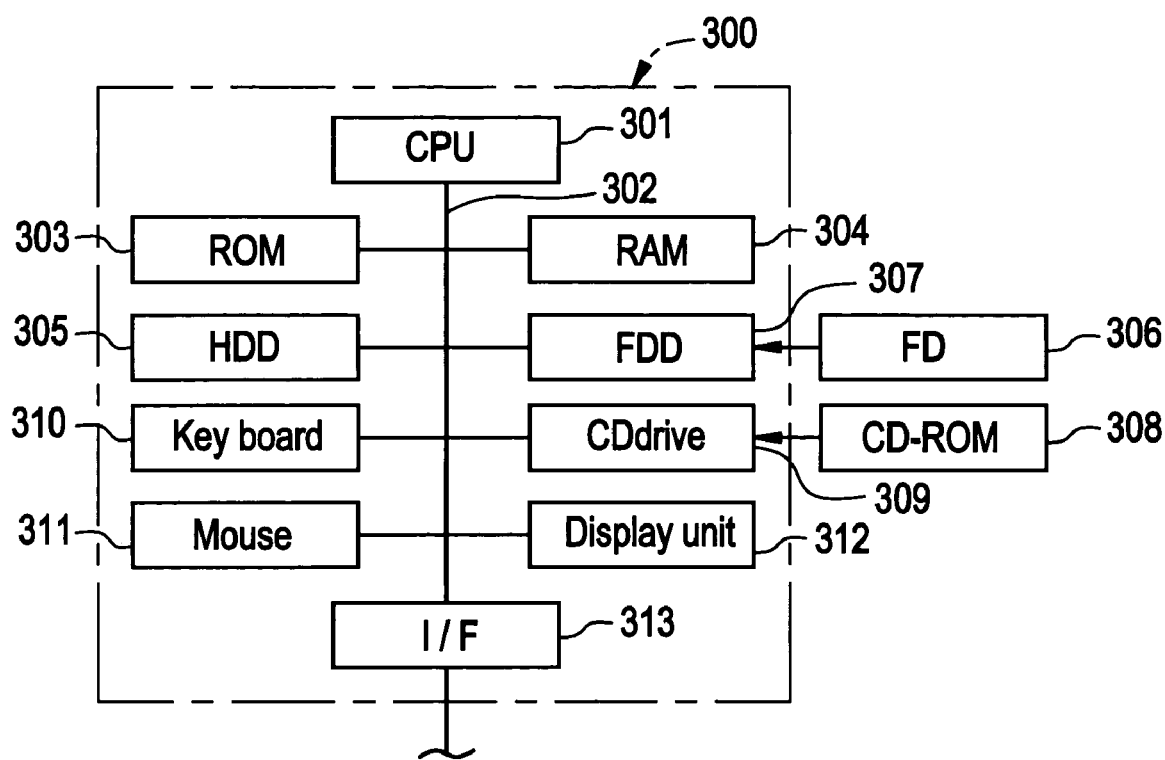
FIG. 3 is a block diagram showing a physical structure of the data processing apparatus.

As shown in FIG. 3, the data processing apparatus 300 has a CPU 301 as a main computer unit. The data processing apparatus 300 also includes a ROM 303, a RAM 304, a HDD 305, an FDD (FD Drive) 307 in which an FD 306 is replaceably loaded, a CD drive 309 in which a CD-ROM 308 is replaceably loaded, a keyboard 310, a mouse 310, a display unit 312, and an I/F unit 313 which are connected to the CPU 301 by bus lines 302.

In the data processing apparatus 300, the hardware elements including the ROM 303, the RAM 304, the HDD 305, the replaceable FD 306, the replaceable CD-ROM 308, etc. correspond to information storage mediums, and at least one of these information storage mediums stores a computer program and various data for the CPU 310 as software.

For example, a computer program for enabling the CPU 301 to perform various data processing processes is stored in the FD 306 and the CD-ROM 308 in advance. The software is installed in the HDD 305 in advance, and is copied to the RAM 304 and read by the CPU 301 when the data processing apparatus 300 is activated.

When the CPU 301 reads an appropriate computer program and performs various data processing processes, the data processing apparatus 300 logically provides a source input means 211, a condition storage means 212, an object generating means 213, an object output means 214, etc. as various functions.

The source supply means 201 of the data processing system 200 comprises, for example, the FD 306 storing source codes therein, and supplies a series of source codes descriptive of operation of the array-type processor 100 by way of a high-level language such as the C language to the source input means 211 of the data processing apparatus 300.

The source input means 211 corresponds to a function for the CPU 301 to control operation of the FDD 307 according to the computer program stored in the RAM 304. The source input means 211 is supplied with source codes from the source supply means 201.

The condition storage means 212 corresponds to a storage area in the HDD 305 whose data is recognized by the CPU 301 according to the computer program stored in the RAM 304. Various limiting conditions corresponding to the physical structure and physical characteristics of the array-type processor 100 are registered in the condition storage means 212 in advance.

The object generating means 213 corresponds to a function for the CPU 301 to perform a certain data processing process according to the computer program. The object generating means 213 generates a series of object codes for sequentially switching contexts of the matrix circuit 105 of the array-type processor 100 from source codes entered by the source input means 211 according to the limiting conditions from the condition storage means 212.

Since the state manager 103 and the matrix circuit 105 are separately provided in the array-type processor 100, when the object generating means 213 generates object codes from source codes according to the limiting conditions which reflect the above structure, it separates a data path corresponding to the matrix circuit 105 and a finite-state machine corresponding to the state manager 103, as shown in FIG. 4.

As described in detail later on, the object generating means 213 generates object codes from source codes according to various processing processes in multiple stages, and refers to necessary limiting conditions from the condition storage means 212 according to the various processing processes in multiple stages. Therefore, the condition storage means 212 stores various limiting conditions with data details which are necessary and sufficient for the various processing processes of the object generating means 213.

The object output means 214 corresponds to a function for the CPU 301 to control the outputting of data from the I/F unit 313 according to the computer program. The object output means 214 outputs a series of object codes generated by the object generating means 23 to the object supply means 202 of the data processing system 200.

The object supply means 202 corresponds to a connector (not shown) interconnecting the I/F unit 313 of the data processing apparatus 300 and the state manager 103 of the array-type processor 100. The object supply means 202 enters object codes output by the data processing apparatus 300 into the I/F unit 101 of the array-typed processor 100.

Since the code memory 102 is connected to the I/F unit 101 of the array-typed processor 100, the code memory 102 stores the entered object codes. The data input means 203 comprises a data generating circuit (not shown), which generates a series of processing data and enters the generated processing data into the data distributor 104 of the array-type processor 100.

Figure 2:
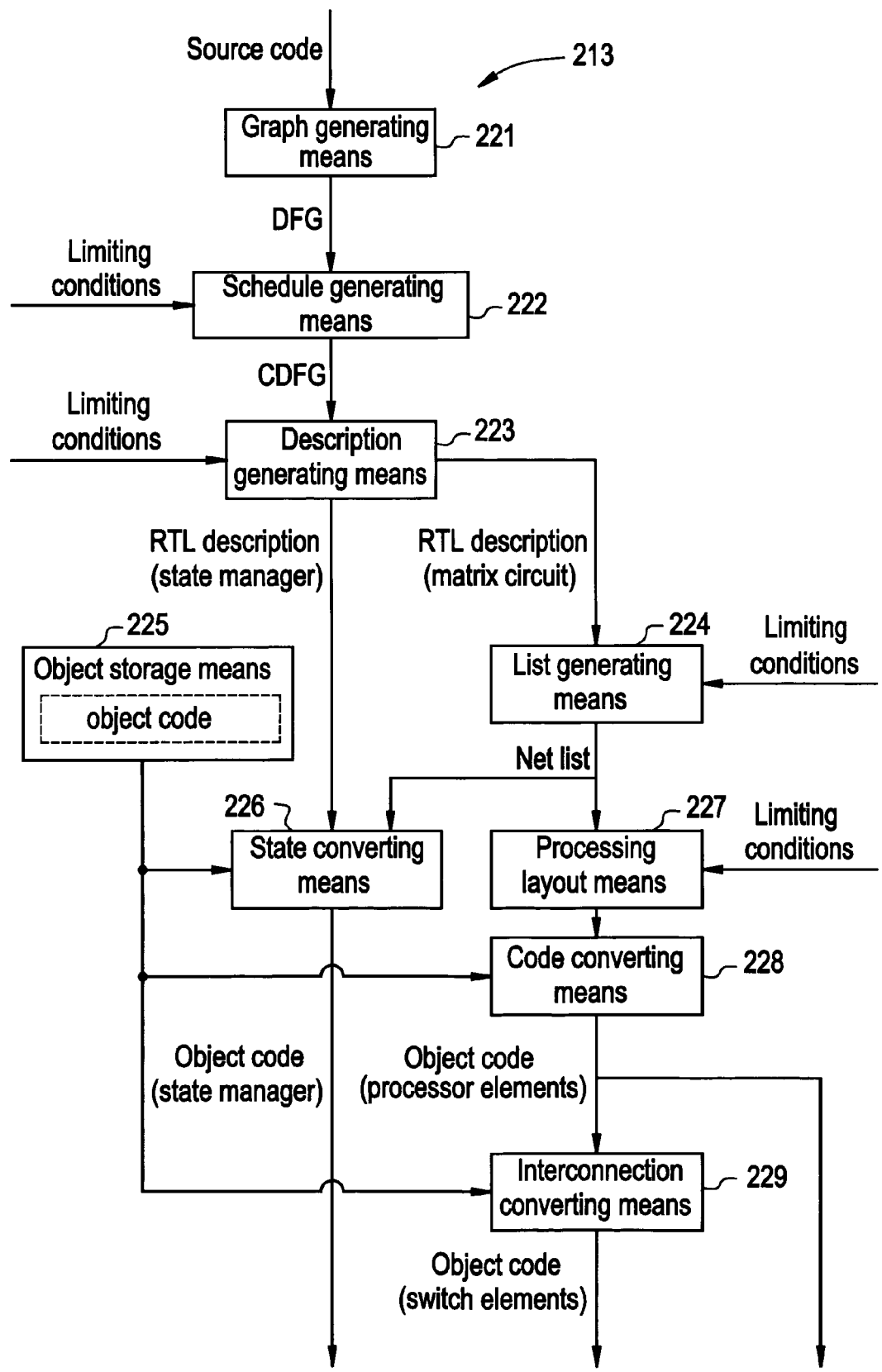
FIG. 2 is a block diagram showing a logical structure of a data processing apparatus.

As shown in FIG. 2, the object generating means 213 of the data processing apparatus 300 comprises a graph generating means 221, a schedule generating means 222, a description generating means 223, a list generating means 224, an object storage means 225, a state converting means 226, a processing layout means 227, a code converting means 228, and an interconnection converting means 229.

The graph generating means 221 analyzes a series of source codes described in the C language or the like to generate a DFG (Data Flow Graph). The schedule generating means 222 generates a CDFG which has scheduled operation states in a plurality of successively transited stages of the array-type processor 100 from the DFG generated by the graph generating means 221 under given limiting conditions, as shown in FIG. 6.

More specifically, as shown in FIG. 7, when a source code describes a plurality of data processing processes associated with processing data, a DFG representing the data processing processes which are associated with each other according to a cause-and-effect relationship is generated by a known process, as shown in FIG. 8.

When CDFG (Control DFG) data is generated from such a DFG, the number of processor elements 107 of the array-type processor 100 and the delay times of the m/nb data buses 109, 110 are referred to as limiting conditions. As shown in FIG. 9, the data processing processes of the DFG are then scheduled sequentially in operation states in a plurality of successively transited stages.

When a plurality of nodes of the DFG are sequentially scheduled, if the number of a plurality of data processing processes which are executed parallel to each other at one time in one operation state exceeds the number of processor elements 107 as a limiting condition, then any exceeding data processing processes are shifted to the operation state in the next stage.

If the accumulated time of a plurality of data processing processes which are executed successively at one time in one operation state exceeds the clock interval of a certain operation state as a limiting condition, then any data processing processes subsequent to the data processing process in excess of the clock interval are shifted to the operation state in the next stage. Similarly, if a plurality of data processing processes which are executed in an operation state include a data processing process that bridges operation cycles, e.g., a port input/output process, a memory access process, or an arithmetic process in a plurality of cycles, then the operation state is shifted to the next stage at the time such a data processing process occurs.

A specific scheduling process for shifting an operation state based on a comparison between the number of arithmetic processes and the number of processor elements 107 will be described below. It is assumed that the array-type processor 100 according to the present embodiment has only two processor elements 107 and a conventional array-type processor (not shown) to be compared has one adder and one subtractor.

The conventional array-type processor is able to perform one adding process and one subtracting process parallel to each other in one operation state, but is unable to perform two adding processes and two subtracting processes parallel to each other in one operation state. The array-type processor 100 according to the present embodiment is able to perform two data processing processes parallel to each other in one operation state, the two data processing processes being freely settable to an adding process or a subtracting process.

As shown in FIG. 8, if a DFG includes two adding processes and two subtracting processes which have input data coming from output data from the two adding processes, then in a scheduling process for the conventional array-type processor, as shown in FIG. 9B, a CDFG is generated to carry out the first adding process in a first state, the first subtracting process and the second adding process parallel to each other in a second state, and the second subtracting process in a third state.

In a scheduling process for the array-type processor according to the present embodiment, as shown in FIG. 9A, a CDFG is generated to carry out the first and second adding processes in a first state with the two processor elements 107 and then the first and second subtracting processes in a second state with the two processor elements 107.

Figure 11:
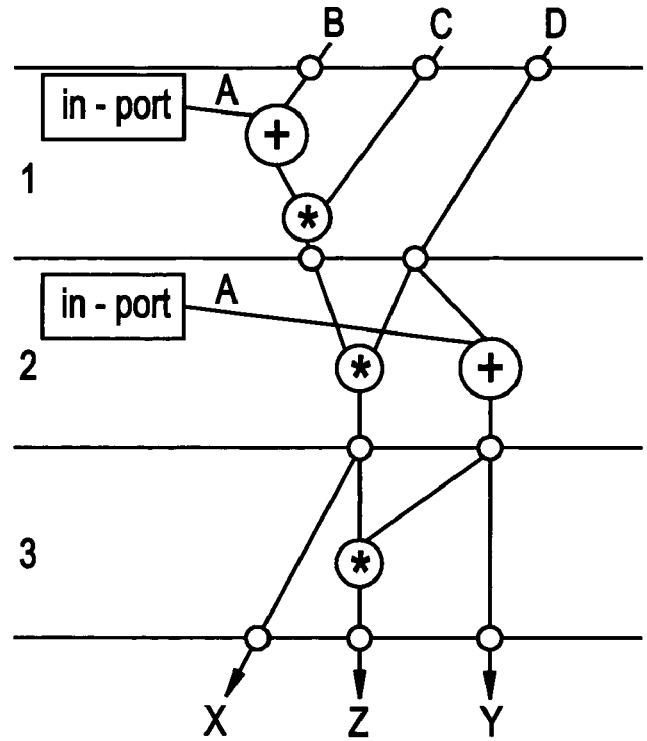
FIG. 11 is a diagram showing a specific example of another CDFG.

A process in which a CDFG is scheduled according to port inputs as a limiting condition and also scheduled according to a delay time as a limiting condition will briefly be described below. In the case where only one port input exists as a limiting condition in one operation state, if a source code describes a plurality of port inputs, as shown in FIG. 10, then the port inputs in the first and third lines of the source code are scheduled in different operation states of a CDFG, as shown in FIG. 11. In the case where the delay time allowed in one operation state is 30 (nsec.), the required time of an adding process is 10 (nsec), and the required time of a multiplying process is 20 (nsec), if a source code describes one adding process and two multiplying processes, as shown in FIG. 10, then the adding process and the first multiplying process are scheduled in one operation state, but the second multiplying process is scheduled in the next operation state, as shown in FIG. 11.

Since each of the processor elements 107 of the array-type processor 100 according to the present embodiment actually has only the 8-bit ALU 115 and the 1-bit ALU 116, one 32-bit data processing process is carried out by four 8-bit ALUs 115 that operate parallel to each other because of the limiting condition.

Four is subtracted from the number of the 8-bit ALUs 115 which is a limiting condition because of the 32-bit data processing process scheduled in one operation state. Therefore, if the number of the 8-bit ALUs 115 is not enough, then the 32-bit data processing process is shifted to the next operation state.

Inasmuch as each of the processor elements 107 has the m/nb ALUs 115, 116, an arithmetic operation is distributed to the mb ALU 115 and the nb ALU 116 and scheduled under the corresponding limiting condition. If each of the processor elements 107 has a circuit resource for executing data processing processes other than the m/nb ALUs 115, 116, then such a circuit resource is also incorporated as a limiting condition and used for scheduling.

Figure 12:
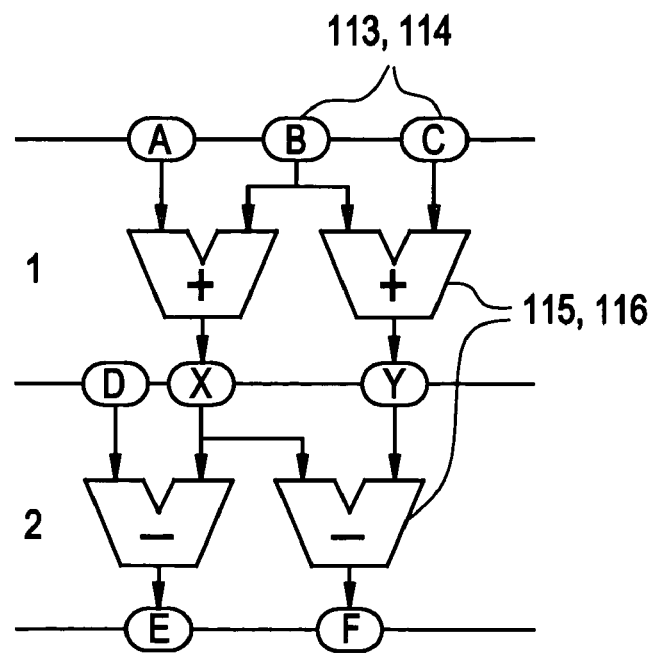
FIG. 12 is a diagram showing a circuit resource assigned to a data processing process represented by a CDFG.

The description generating means 223 generates an RTL (Register Transfer Level) description in operation states in a plurality of stages separately for the matrix circuit 105 and the state manager 103 from a CDFG generated by the schedule generating means 222 under given limiting conditions. At this time, the processing capabilities of the processor elements 107 and the switch elements 108 are referred to as limiting conditions, and, as shown in FIGS. 9B and 12, the m/nb ALUs 115, 116 for carrying out data processing processes and data transfer processes are assigned.

The assignment at this time is limited to the determination of which process is to be carried out by which type of circuit resource in the array-type processor 100, but is not addressed to the determination of which data processing process is to be carried out by which of the m/nb ALUs 115, 116 and the determination of the position of the m/nb register files 113, 114 for holding processing data associated in operation stages in a plurality of stages. According to this assignment, the data of a combination of minimum circuit resources to be used in each of operation stages in a plurality of stages is generated by trial-and-error efforts.

Figure 13A:
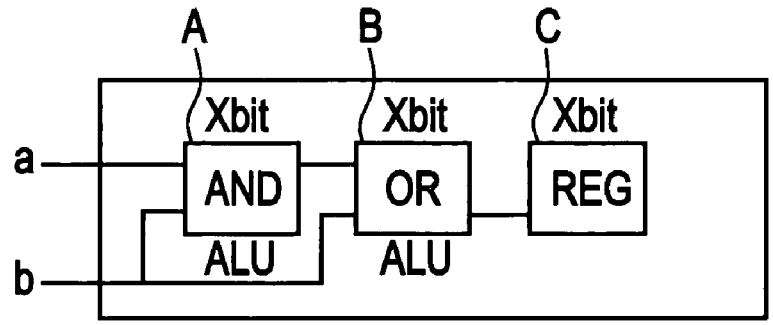
FIGS. 13A and 13B are diagrams showing a circuit resource "m/nb" assigned to a data processing process "xb"
Figure 13B:
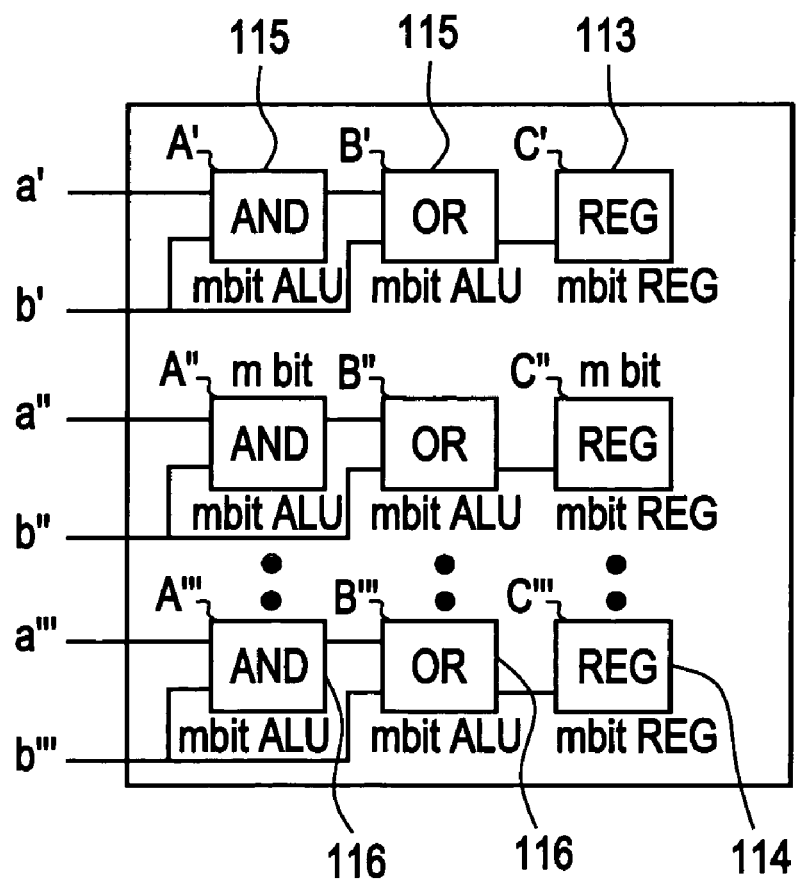

The list generating means 224 generates a net list of the processor element 107 in each of operation stages in a plurality of stages for each of the m/nb circuit resources such as the m/nb ALUS 115, 116, as shown in FIGS. 13A and 13B, from an RTL description of the matrix circuit 105 generated by the description generating means 223 under given limiting conditions.

More specifically, if an RTL description contains "xb(x-(bit)" data processing processes more than "mb", then the list generating means 224 calculates an integral part "Y" of the result produced by dividing "x" by "m", and calculates an integer "Z" of the result produced by dividing the remainder by "n". The list generating means 224 then detects natural numbers "Y", "Z" satisfying the equation "x=Ym+Zn", and assigns "xb" data processing processes to Y mb ALUs 115 and mb register files 113 and Z nb ALUs 116 and nb register files 114.

The object storage means 225 corresponds to a storage area in the HDD 305 whose data is recognized by the CPU 301. In the object storage means 225, there are registered, in advance, various object codes corresponding to operation states in a plurality of stages of the state manager 103, and various object codes of the processor elements 107 and the switch elements 108 of the matrix circuit 105.

The state converting means 226 converts an RTL description of the state manager 103 which is generated by the description generating means 223 into a corresponding object code according to a net list of the matrix circuit 105 which is generated by the list generating means 224.

The processing layout means 227 assigns net lists of the matrix circuit 105 which are generated in respective operation states in a plurality of stages by the list generating means 224 to respective processor elements 107 arrayed in matrix in respective contexts in a plurality of cycles.

Figure 14A:
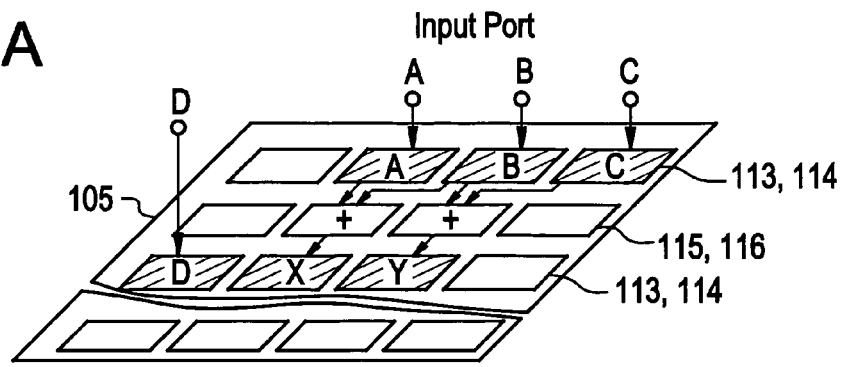
FIGS. 14A and 14B are diagrams showing net lists assigned respectively to two successive contexts.
Figure 14B:
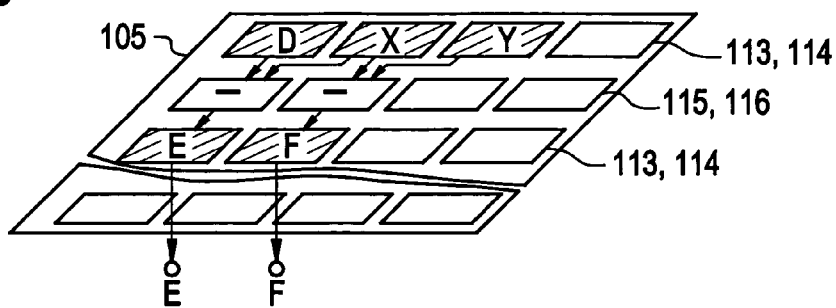
Figure 15:
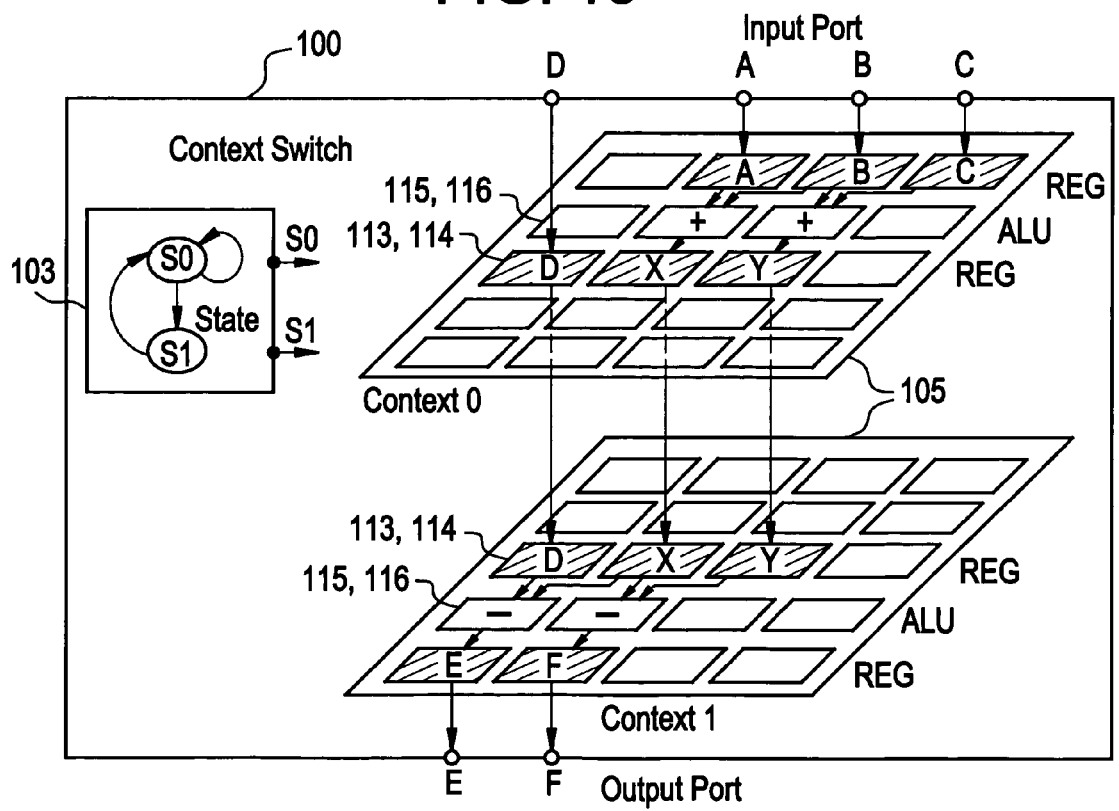
FIG. 15 is a diagram showing an association between the net lists of the two successive contexts.

At this time, as shown in FIGS. 14A and 14B, the processing layout means 227 first assigns net lists to the m/nb register files 113, 114 irrespective of the association of processing data in respective contexts in a plurality of cycles, and then adjusts the assigned positions to align the positions of the m/nb register files 113, 114 to which the net lists associated with the processing data have been assigned, in the contexts of a plurality of consecutive cycles. In this manner, as shown in FIG. 15, the processing layout means 227 assigns the net lists associated with the processing data in the contexts of a plurality of consecutive cycles commonly to the m/nb register files 113, 114 in given positions in the matrix circuit 105.

The net lists of the m/nb register files 113, 114 associated with the processing data in the contexts of a plurality of consecutive cycles are given the same name to express their association. The layout of the net list in each of the above contexts and the layouts of net lists in the contexts are optimized according to a repetitive process by applying an existing a repetitive improved algorithm such as a simulated annealing process.

The layout of a net list in the processing layout means 227 is carried out for each context, and a process of shifting a net list which cannot be arranged in a certain context to another context is not performed. Therefore, if a situation occurs in the processing layout means 227 in which all net lists required for a certain context cannot be arranged, then the processing layout means 227 supplies the data of the situation to the schedule generating means 222, which regenerates a CDFG using the supplied data as a limiting condition.

For the sake of brevity, one m/nb register file 113 or 114 temporarily holds one m/nb data in the above embodiment. However, if the m/nb register files 113, 114 are capable of reading and writing a plurality of m/nb data independently of each other at different addresses, for example, then one m/nb register file 113 or 114 may be able to read and write a plurality of m/nb data in a plurality of contexts unless the writing of data and the reading of data occur simultaneously in one context.

The code converting means 228 converts a next lift assigned to the processor element 107 by the processing layout means 227 to a corresponding object code. The interconnection converting means 229 converts a net list of the switch element 108 into an object code depending on an object code of the processor element 107 which is converted by the code converting means 228.

The various means of the data processing apparatus 300 which have been described above are implemented using pieces of hardware including the FDD 307, the I/F unit 312, etc. Mainly, however, these means are implemented by the CPU 301, which is a piece of hardware of the data processing apparatus 300, which functions according to software stored in an information storage medium such as the RAM 304, etc.

The software is stored in the information storage medium such as the RAM 304, etc. as a computer program for enabling the CPU 301, etc. to perform data processing processes including a process of storing, in the HDD 305 or the like, the data of various limiting conditions representing the physical structure and physical characteristics of the array-type processor 100, a process of reading the data stored in the FD 306 to the FDD 107 thereby to enter source codes of operating descriptions of the array-type processor 100, a process of generating object codes of the array-type processor 100 from the entered source codes under limiting conditions, and a process of outputting the generated object codes from the I/F unit 313.

The software for generating object codes from source codes is stored in the information storage medium such as the RAM 304, etc. as a computer program for enabling the CPU 301, etc. to perform data processing processes including a process of storing object codes of the state manager 103 and object codes of the matrix circuit 105 in the HDD 305 or the like, a process of generating a DFG by analyzing a series of source codes described in the C language, a process of generating a CDFG in which operation states in a plurality of successively transited stages of the array-type processor 100 are scheduled from the generated DFG under given limiting conditions, a process of generating an RTL description in operation states in a plurality of stages separately for the matrix circuit 105 and the state manager 103 from the generated CDFG under given limiting conditions, a process of generating net lists of the processor elements 107 in respective operation states in a plurality of stages for the respective m/nb circuit resources such the m/nb ALUs 115, 116 from the generated RTL description of the matrix circuit 105 under given limiting conditions, a process of converting the RTL description of the state manager 103 into a corresponding object code depending on the generated net lists of the matrix circuit 105, a process of assigning the generated net lists of the matrix circuit 105 in the respective operation states in a plurality of stages to the processor elements 107 arrayed in matrix in respective contexts in a plurality of cycles, a process of converting the net lists assigned to the processor elements 107 into a corresponding object code, and a process of converting the net lists of the switch elements 108 into an object code according to the converted object code of the processor elements 107.

The above computer program is stored in an information storage medium such as the CD-ROM 108 or the like, and supplied therefrom to the data processing apparatus 300. The information storage medium is also able to store limiting conditions of the condition storage means 212 and object codes of the object storage means 225 as structural data.

The data processing system 200 thus constructed operates as follows: When a source code representing an operation description of the array-type processor 100 is supplied from the source supply means 201 to the data processing apparatus 300, the data processing apparatus 300 converts the source code into an object code, and supplies the object code to the array-type processor 100.

The array-type processor 100 stores the data of the supplied object code. When the array-type processor 100 is supplied with a series of processing data from the data input means 203, the array-type processor 100 processes the supplied data according to the object code.

Specifically, the data processing apparatus 300 registers therein various limiting conditions corresponding to the physical structure and physical characteristics of the array-type processor 100 and various object codes of the stage manager 103, the processor elements 107, and the switch elements 108.

Figure 16:
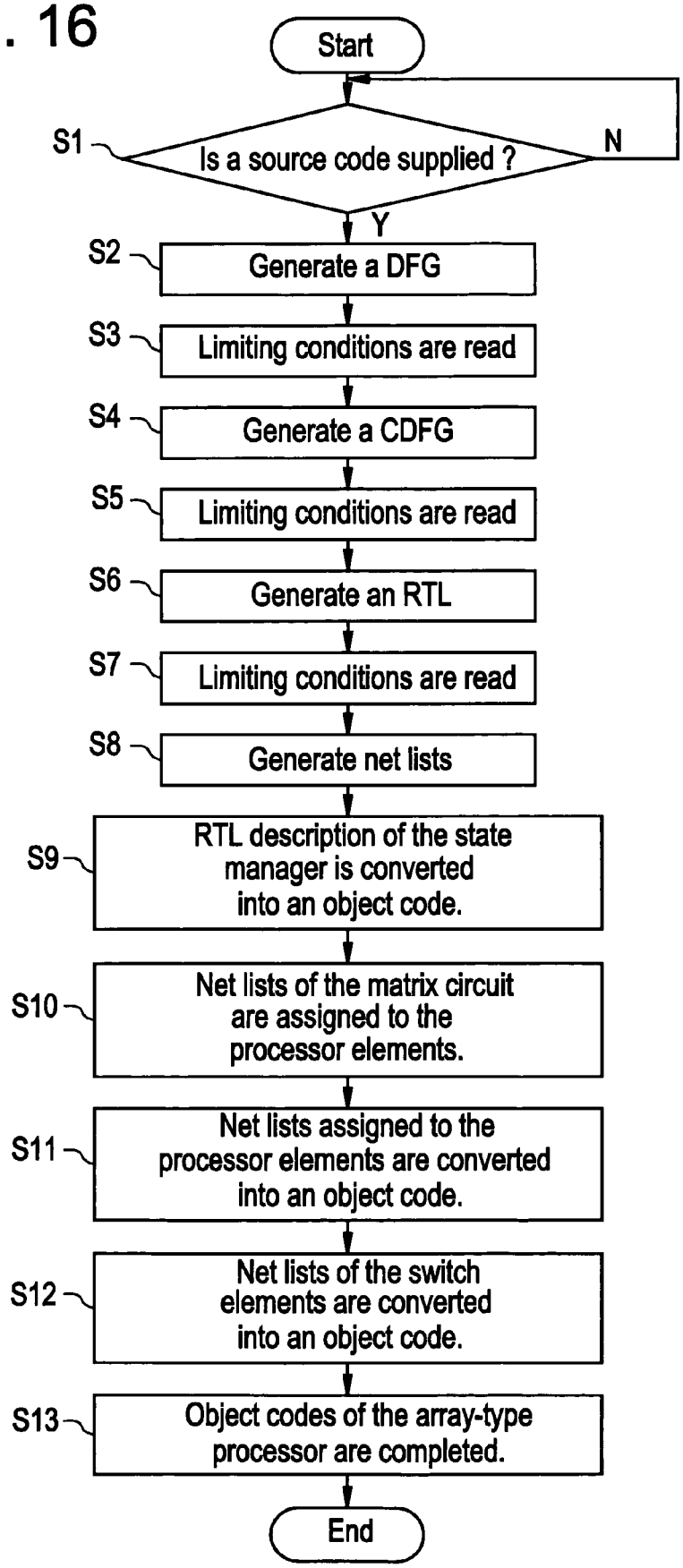
FIG. 16 is a flowchart of a data processing method carried out by the data processing apparatus.

When the data processing apparatus 300 is supplied with a source code descriptive of operation of the array-type processor 100 in the C language or the like in step S1 shown in FIG. 16, the data processing apparatus 300 analyzes the source code and generates a DFG as shown in FIGS. 7 and 8 in step S2.

Then, the number of processor elements 107 of the array-type processor 100 and the delay times of the m/nb data buses 109, 110 are read as limiting conditions for generating a CDFG from the DFG in step S3. As shown in FIGS. 6A, 6B, and 9A, a CDFG in which operation states in a plurality of successively transited stages of the array-type processor 100 are scheduled is generated from the DFG under given limiting conditions in step S4.

The processing capabilities of the processor elements 107 and the switch elements 108 are read as limiting conditions for generating an RTL description from the CDFG in step S5. As shown in FIG. 12, the m/nb ALUs 115, 116 are assigned to the data processing processes of the CDFG according to these limiting conditions, and an RTL description in operation states in a plurality of stages is generated separately for the matrix circuit 105 and the state manager 103 in step S6.

Then, the bit numbers of the m/nb register files 113, 114 and the m/nb ALUs 115, 116 are read as limiting conditions for generating net lists from the RTL description in step S7. As shown in FIGS. 13A and 13B, net lists of the processor elements 107 in respective operation states in a plurality of stages are generated for each of the m/nb circuit resources such as the m/nb ALUs 115, 116 from the RTL description of the matrix circuit 105 under given limiting conditions in step S8.

When the net lists of the matrix circuit 105 are generated in the respective operation states in a plurality of stages, the RTL description of the state manager 103 is converted into a corresponding object code in step S9. The object code of the state manager 103 is thus generated.

Then, the net lists of the matrix circuit 105 generated in the respective operation states in a plurality of stages are assigned to the processor elements 107 arrayed in matrix in respective contexts in a plurality of cycles in step S10. Then, the net lists assigned to the processor elements 107 are converted into an object code in step S11. In this manner, the object code of the processor elements 107 is generated.

When the object code of the processor elements 107 is generated, the net lists of the switch elements 108 are converted into an object code according to the object code of the processor elements 107 in step S12. Since the object code of the switch elements 108 is generated, object codes of the array-type processor 100 for the state manager 103, the processor elements 107, and the switch elements 108 are completed in step S13.

The object codes thus generated by the data processing apparatus 300 are then set as data in the array-type processor 100, as described above. In the array-type processor 100, the state manager 103 holds an object code supplied from an external source and generates instruction pointers for the respective processor elements 107, and each of the instruction pointers specifies one of a plurality of a plurality of operation instructions stored in the instruction memory 111 for each of the processor elements 107.

The specified operation instruction is decoded by the instruction decoder 112 to control connections of the processor elements 107 with the switch elements 108, connections of in the processor elements 107 with the internal interconnection resources 117, and data processing processes of the m/nb ALUs 115, 116. The array-type processor 100 according to the present embodiment now establishes a hardware system for carrying out data processing processes corresponding to the object codes.

A series of processing data supplied from an external source via the data input means 203 is divided by the data distributor 104 into mb data and nb data, which are processed by the mb ALU 115 and the nb ALU 116 in each of the processor elements 107 whose connections and data processing processes are controlled as described above.

Since the array-type processor 100 is capable of processing the "8-(bit)" mb data and the "1-(bit)" nb data parallel to each other in each of the processor elements 107 according to the above object codes, even if the bit number of a series of processing data supplied from the external source changes, the processing data is divided into separate data depending on the bit number for efficient parallel data processing.

Because the m/nb register files 113, 114 of each of the processor elements 107 temporarily holds and outputs supplied m/nb data, the m/nb data processed by the mb ALU 115 and the nb ALU 116 in each of the processor elements 107 can temporarily be neatly held respectively by the dedicated m/nb register files 113, 114.

Inasmuch as "nb" comprises "1 (bit)" in the array-type processor 100, the array-type processor 100 is capable of processing minimum-bit data with the nb ALU 116, so that the data processing process can reliably be performed even if the number of bits of processing data changes to various numbers.

In the data processing system 200, when processing data is entered into the array-type processor 100, a source code can be supplied to the data processing apparatus 300 and a corresponding object code can be entered into the array-type processor 100. Therefore, operation states of the array-type processor 100 can be switched in various fashions on a real-time basis.

In the data processing system 200, the array-type processor 100 has the matrix circuit 105 and the state manager 103 separately from each other. The data processing apparatus 300 separates a data path and a finite-state machine from a series of source codes descriptive of operation of the array-type processor 100, and generates a series of object codes.

The data path corresponds to the matrix circuit 105 of the array-type processor 100, and the finite-state machine corresponds to the state manager 103. Therefore, the software of the data processing apparatus 300 and the hardware of the array-type processor 100 matches each other well.

The array-type processor 100 according to the present embodiment is basically different from the conventional CPUs as to both structure and operation. Consequently, the structure of object codes of the array-type processor 100 is also basically different from the structure of object codes of the conventional CPUs. However, since the data processing apparatus 300 can well generate an object code of the array-type processor 100 from a source code descriptive of operation of the array-type processor 100 according to a general process, the array-type processor 100 can well be operated.

The data processing apparatus 300 generates a DFG from a source code, schedules operation states in a plurality stages in a CDFG, and assigns net lists generated from the CDFG to respective contexts in a plurality of cycles. Therefore, the data processing apparatus 300 can generate an object code for sequentially switching contexts of the array-type processor 100 in respective operation cycles.

When an object code is generated from a source code, a finite-state machine and a data path are separated from each other. Thus, an object code of the array-type processor 100 having the matrix circuit 105 and the state manager 103 separate from each other can well be generated.

Furthermore, because net lists of the m/nb circuit resources of the processor elements 107 from the RTL description of the matrix circuit 105 are generated, an object code of the array-type processor 100 whose description is divided for mb data and nb data can well be generated.

As "xb" data processing processes of the RTL description are assigned to Y mb ALUs 115 and Z nb ALUS 116 where "x=Ym+Zn", the "xb" data processing processes can be assigned as appropriate numbers of processes to the m/nb ALUS 115, 116.

Particularly, after an integral part "Y" of the result produced by dividing "x" by "m" is calculated, an integer "Z" of the result produced by dividing the remainder by "n" is calculated. Thus, the "xb" data processing processes are maximally assigned to the mb ALUs 115 whose bit number is large, and only the remainder is assigned to nb ALUs 116 whose bit number is small. Since "nb" is "1 (bit)", the remainder of the "xb" data processing processes assigned to the mb ALU 115 can be assigned to the nb ALU 116 irrespective of the bit number of the remainder.

Furthermore, since net lists associated with processing data in the contexts of a plurality of consecutive cycles are assigned commonly to the m/nb register files 113, 114 in given positions in the matrix circuit 105, it is possible to generate an object code for holding processing data associated in the contexts of a plurality of consecutive cycles of the array-type processor 100 in the m/nb register files 113, 114 in given positions.

Particularly, after net lists are first assigned to the m/nb register files 113, 114 irrespective of the association of processing data in respective contexts in a plurality of cycles, and then the assigned positions are adjusted to align the positions of the m/nb register files 113, 114 to which the net lists associated with the processing data have been assigned, in the contexts of a plurality of consecutive cycles. Thus, it is possible to generate an object code for holding associated processing data in the m/nb register files 113, 114 in given positions according to a given data processing process.

The computer program of the data processing apparatus 300 for generating an object code from a source code is in a one-to-one correspondence to the array-type processor 100. Therefore, the information storage medium such as the CD-ROM 108 or the like which stores the computer program should preferably be sold in combination with one or more array-type processors 100.

In that case, since the limiting conditions stored in the condition storage means 212 and the object codes stored in the object storage means 225 also correspond to the array-type processor 100, the limiting conditions and the object codes should preferably be stored as structural data together with the computer program in the information storage medium.

If a plurality of kinds of the array-type processor 100 are sold, then one computer program shared by those kinds of the array-type processor 100 should be stored and sold in one information storage medium, and when the kinds of the array-type processor 100 are selectively sold, they should preferably be sold together with a plurality of kinds of information storage mediums storing corresponding limiting conditions and object codes.

The present invention is not limited to the above embodiment, but various changes and modifications may be made therein without departing from the scope of the invention. For example, in the above embodiment, the data processing apparatus 300 carries out a sequence of processing operations to generate an object code from a source code according to a single computer program. However, a data processing apparatus and a computer program for generating an RTL description from a source code, a data processing apparatus and a computer program for generating a net lift from an RTL description, and a data processing apparatus and a computer program for generating an object code from a net list can be provided separately from each other.

In the above embodiment, when "xb" data processing processes of the RTL description are assigned to Y mb ALUs 115 and Z nb ALUs 116 where "x=Ym+Zn", an integral part "Y" of the result produced by dividing "x" by "m" is first calculated, and then an integer "Z" of the result produced by dividing the remainder by "n" is calculated, so that the "xb" data processing processes are assigned to the mb ALUs 115 whose bit number is large, and only the remainder is assigned to nb ALUs 116 whose bit number is small.

However, if "nb" is "1 (bit)" and "mb" is "32 (bits)", then "30 (bits)" data processing processes may be carried out by 30 nb ALUs 116. To avoid this, a certain threshold should preferably be set up for assigning data processing processes to the m/nb ALUs 115, 116, and after an integral part "Y" of the result produced by dividing "x" by "m" is calculated, if the remainder is smaller than the threshold, then an integer "Z" should preferably be calculated, and if the remainder is equal to or greater than the threshold, then "1" should preferably be added to "Y" to make "Z=0".

According to this modification, since the remainder of "xb" data processing processes maximally assigned to the mb ALU 115 can be assigned to an appropriate one of the m/n ALUs 115, 116 depending on the bit number, if "nb" is "1 (bit)" and "mb" is "32 (bits)", then "9 (bits)" or more data processing processes may be performed by the mb ALU 115, and "8 (bits)" or less data processing processes may be performed by the nb ALU 116.

In the above embodiment, the array-type processor 100 has two types of circuit resources, i.e., a type where "mb" is "8 (bits)" and a type where "nb" is "1 (bit)". The number of types of circuit resources and their bit numbers may be set to various values.

According to such a modification, the data processing apparatus 300 can generate suitable object codes for the array-type processor 100 by registering appropriate limiting conditions. For example, if the array-type processor has only mb ALUs 115, then an integral part "Y" of the result produced by dividing "x" by "m" is first calculated, and if no remainder is present, then "xb" data processing processes should preferably be assigned to Y mb ALUs 115 where "x=Ym", and if there is a remainder, then "xb" data processing processes should preferably be assigned to (Y+1) mb ALUs 115 where "x≈(Y+1)m".

In the above embodiment, the processor element 107 of the array-type processor 100 performs data processing processes with the m/nb ALUs 115, 116. However, other circuit resources for carrying out data processing processes may be provided in the processor element 107.

For example, a circuit resource referred to as a DMU (Data Manipulation Unit) for manipulating mb data and nb data with at least a mask circuit may be provided in the processor element 107. The applicant of the present application has filed a patent application No. 2001-263804 on such an array-type processor 100. According to this circuit resource, limiting conditions corresponding to the circuit resource may be set up to allow the data processing apparatus 300 to generate appropriate object codes of the array-type processor 100.

In the above embodiment, the array-type processor 100 performs data processing processes with only the processor elements 107 of the matrix circuit 105. however, a dedicated arithmetic circuit may be provided outside of the matrix circuit 105.

For example, since multipliers are generally large in circuit scale, they may be disposed outside of the matrix circuit 105 for access from the processor elements 107. In this case, limiting conditions corresponding to the circuit resource may also be set up to allow the data processing apparatus 300 to generate appropriate object codes of the array-type processor 100. When the processor elements 107 gain access to the circuit outside of the matrix circuit 105, such access poses a limiting condition for state transitions for scheduling a DFG in a CDFG.

In the above embodiment, the array-type processor 100 where each of the processor elements 107 as processing circuits comprises the m/nb ALUs 115, 116 as arithmetic and logic units is illustrated as a parallel operation apparatus. However, a parallel operation apparatus may comprise a DRL (Dynamic Reconfigurable Logic) apparatus where processing circuits comprise a LUT (Look Up Table).

In above embodiment, the hardware arrangement of the array-type processor 100 is changed by updating operation instructions set in the processor elements 107. According to the above modification, since the hardware arrangement of the DRL apparatus is changed by updating data registered in the LUT, it is possible for the data processing apparatus 300 to generate an object code for updating data registered in the LUT.

In the above embodiment, the instruction memory 111 of the processor element 107 adjacent to the switch element 108 doubles as the instruction memory of the switch element 108, and the state manager 103 supplies a set of generated instruction pointers for the processor element 107 and the switch element 108 to the instruction memory 111 of the processor element 107.

However, the switch element 108 may have a dedicated instruction memory of its own separately from the instruction memory 111 of the processor element 107, and the state manager 103 may supply instruction pointers for the processor element 107 and the switch element 108 respectively to the instruction memory 111 of the processor element 107 and the instruction memory of the switch element 108.

It is also possible to use the instruction memory of the switch element 108 to double as the instruction memory of the processor element 107, and the state manager 103 may supply a set of instruction pointers for the processor element 107 and the switch element 108 to the instruction memory of the switch element 108.

In the above embodiment, the array-type processor 100 has only one state manager 103. However, the array-type processor 100 may have a plurality of state managers each for managing a given number of processor elements 107. Preferably, the state managers may be managed by a representative one of them, or a master manager (not shown) may be provided for managing those state managers.

In the above embodiment, since net lists associated with processing data in the contexts of a plurality of consecutive cycles are assigned commonly to the m/nb register files 113, 114 in given positions in the matrix circuit 105, after net lists are first assigned to the m/nb register files 113, 114 irrespective of the association of processing data in respective contexts in a plurality of cycles, and then the assigned positions are adjusted to align the positions of the m/nb register files 113, 114 to which the net lists associated with the processing data have been assigned, in the contexts of a plurality of consecutive cycles.

However, after the positions in the matrix circuit 105 of the m/nb register files 113, 114 to which the net lists associated with the processing data in the respective contexts in a plurality of cycles have commonly been assigned are fixed, other net lists may be assigned to other m/nb register files 113, 114 in respective contexts in a plurality of cycles.

Alternatively, after the relative positions in the matrix circuit 105 of the m/nb register files 113, 114 to which the net lists associated with the processing data in the respective contexts in a plurality of cycles have commonly been assigned are fixed, other net lists may be assigned to other m/nb register files 113, 114 in respective contexts in a plurality of cycles while the relative positions are being maintained.

Figure 17A:
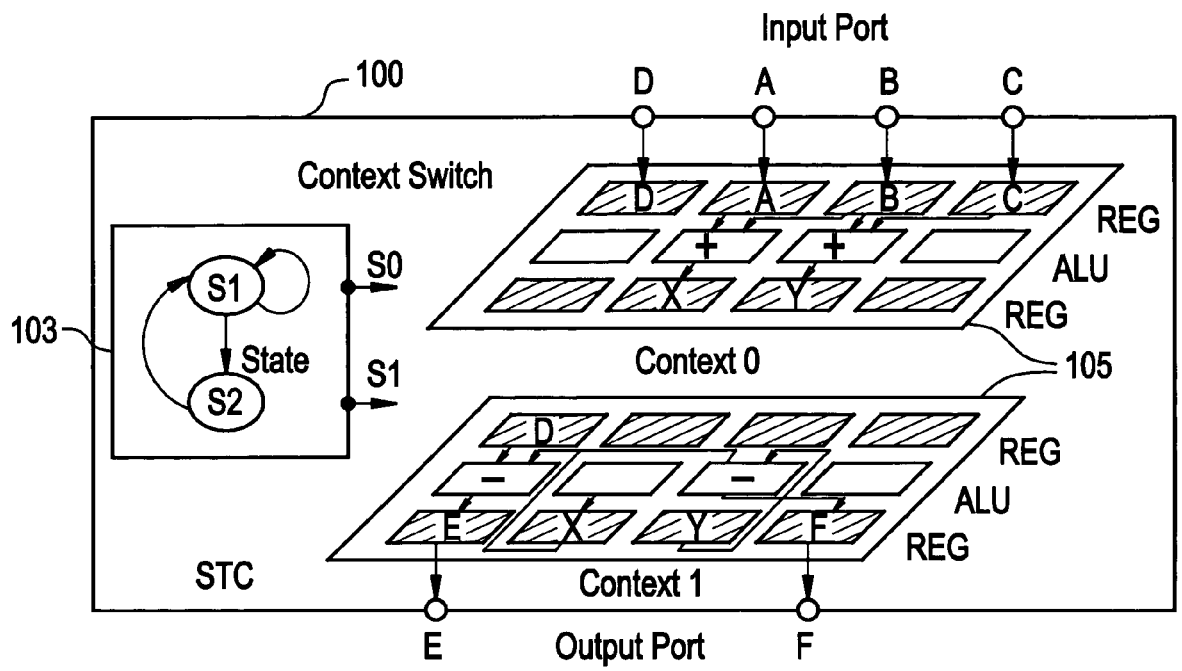
FIG. 17A is a diagram showing net lists assigned to two contexts of the array-type processor according to the present invention.

In these modifications, because the range in which the circuit resources are used in respective contexts can be reduced, as shown in FIG. 17A, net lists can be assigned in respective contexts even if the number of processor elements 107 arrayed in the matrix circuit 105 is small.

Figure 17B:
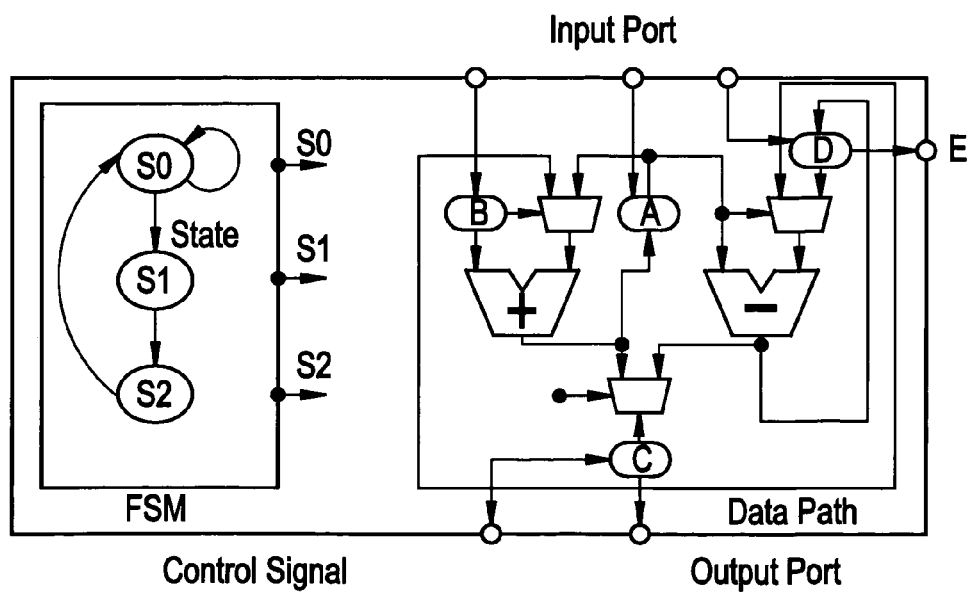
FIG. 17B is a diagram showing a net list assigned to a plane in a conventional parallel operation apparatus.

As shown in FIG. 17B, a conventional FPGA (Field Programmable Gate Array) or ASIC (Application Specific Integrated Circuit) has nets lists in respective contexts in a plurality of cycles, assigned to circuit resources in one plane. Therefore, the conventional FPGA or ASIC needs a number of dedicated circuit resources, and lacks data processing versatility because its hardware arrangement cannot be changed once it is constructed.

However, the array-type processor 100 according to the present embodiment has better data processing versatility because its hardware arrangement can be changed by an object code. The circuit scale of circuit resources arrayed in one plane of the array-type processor 100 is reduced as a sequence of data processing processes are carried out in a time-division manner in respective contexts in a plurality of cycles.

In the above embodiment, the operation states in a plurality of successively transited stages managed by the state manager 103 and the contexts in respective operation cycles sequentially switched by the matrix circuit 105 are held in a one-to-one correspondence. However, a plurality of operation states assigned to one context may be detected from operation states in a plurality of stages according to limiting conditions, and the detected operation states may be assigned to one context.

Figure 18:
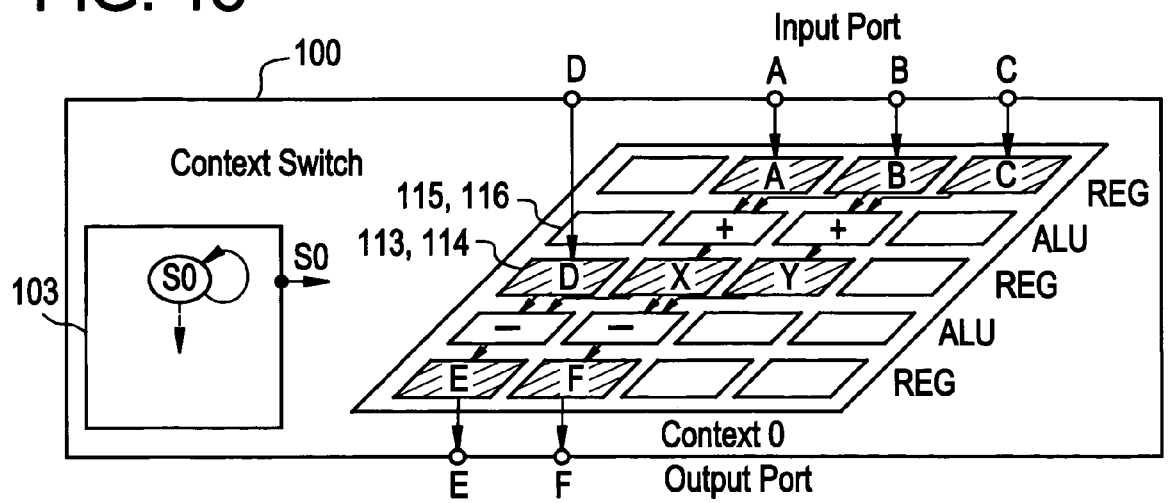
FIG. 18 is a diagram showing net lists in two successive operating states assigned to a single context.

For example, as shown in FIG. 15, the m/nb register files 113, 114 are commonly positioned, but the m/nb ALUs 115, 116 are not positionally superposed, in two successive operation states assigned to two successive contexts. In this case, as shown in FIG. 18, the two successive operation states may be assigned to one context.

Figure 19A:
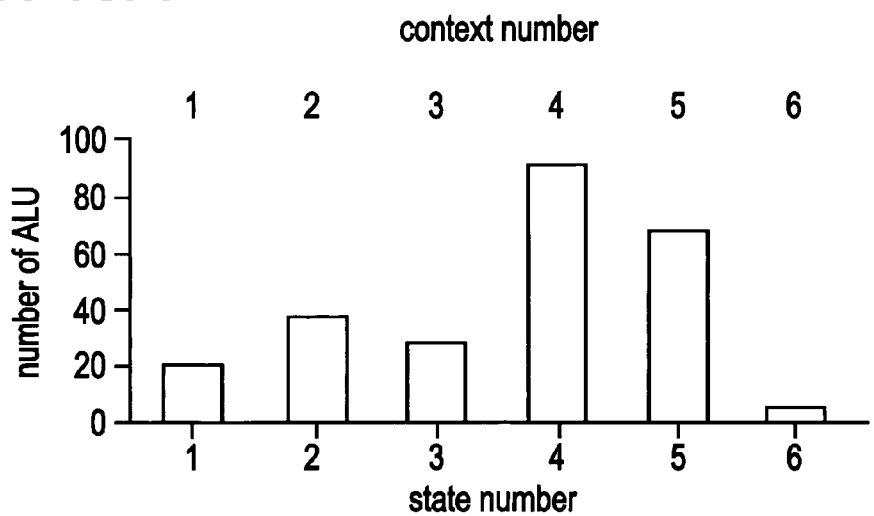
FIGS. 19A and 19B are diagrams showing the associative relationship between operating states and contexts depending on the assigned number of m/nb ALUs.

More specifically, a process of scheduling operating states is carried out according to a plurality of limiting conditions, and when memory access occurs, the operation states are shifted irrespective of the number of m/nb ALUs 115, 116 to be assigned. Therefore, as shown in FIG. 19A, an operation state may occur in which the number of m/nb ALUs 115, 116 to be assigned is small. If a plurality of operation states whose data have been generated are assigned in a one-to-one correspondence to a plurality of contexts, only a small portion of the m/nb ALUS 115, 116 arrayed in the array-type processor 100 may operated in a certain context.

Figure 19B:
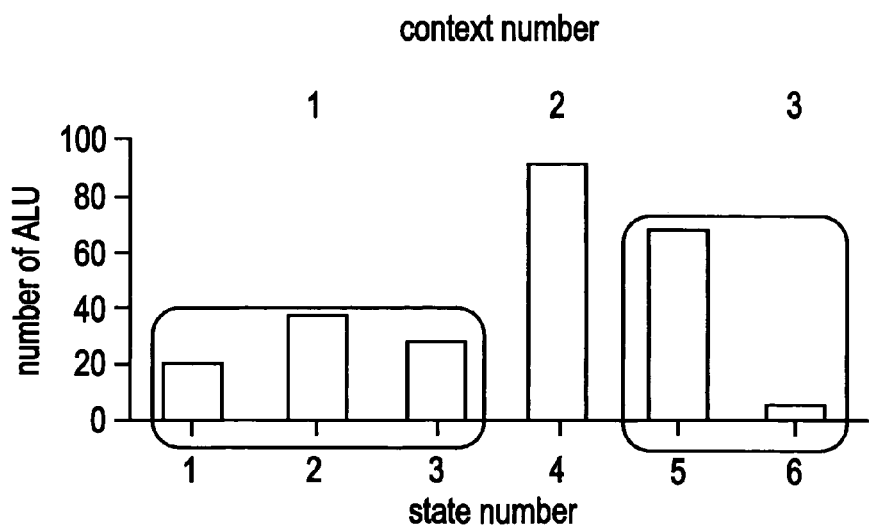

By sequentially integrating the number of m/nb ALUs 115, 116 to be assigned in a plurality of successive operation states and a context is shifted each time the integrated number exceeds a certain allowable number, then, as shown in FIG. 19B, as many m/nb ALUs 115, 116 as possible may be assigned to each of a plurality of contexts.

Figure 20:
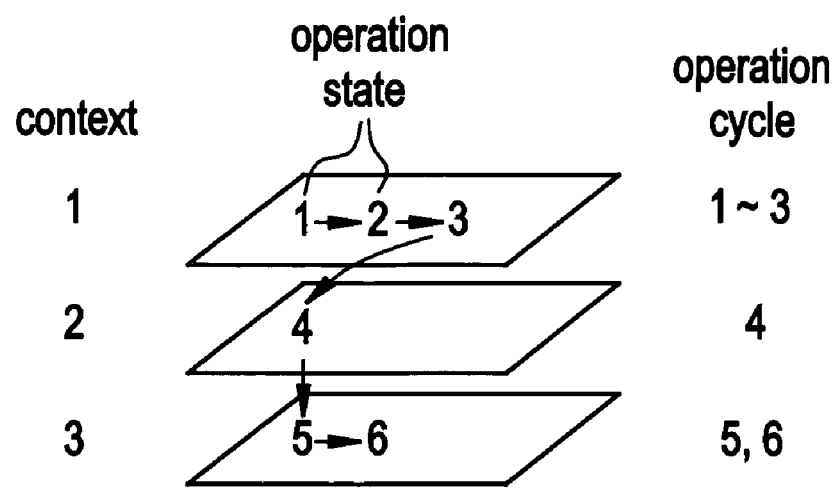
FIG. 20 is a diagram showing a plurality of successive operating states assigned to a single context.

For example, if first through third operation states are assigned to a first context, and fifth and sixth operation states are assigned to a third context, then the array-type processor 100 which operates according to the object program performs, as shown in FIG. 20, a data processing operation in the first operation state in the first context in a first operation cycle, a data processing operation in the second operation state in the first context in a second operation cycle, and a data processing operation in the third operation state in the first context in a third operation cycle.

In a fourth operation cycle, the array-type processor 100 switches the first context to a second context, and performs a data processing operation in a fourth operation state. In a fifth operation cycle, the array-type processor 100 switches the second context to the third context, and performs a data processing operation in a fifth operation state.

As described above, when a plurality of operation states are assigned to one context, the time required for the array-type processor 100 to process the data is the same as the time required to process data when one operation state is assigned to one context. However, since the number of contexts whose data is set in an object code is reduced, the amount of data of the object code is compressed.

The storage capacity of the code memory 102 for temporarily storing object codes of the array-type processor 100 can also be reduced, and the number of times that contexts of the matrix circuit 105 are switched by the state manager 103 can also be reduced. Therefore, the power consumption of the code memory 102 and the state manager 103 can be reduced.

Figure 21:
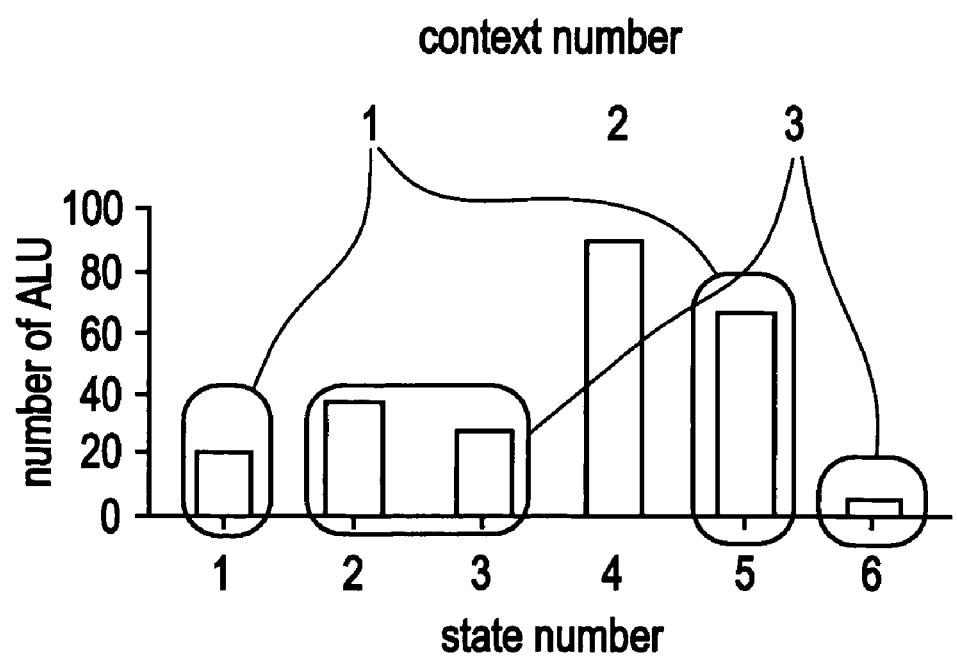
FIG. 21 is a diagram showing the associative relationship between operating states and contexts depending on the assigned number of m/nb ALUs.
Figure 22:
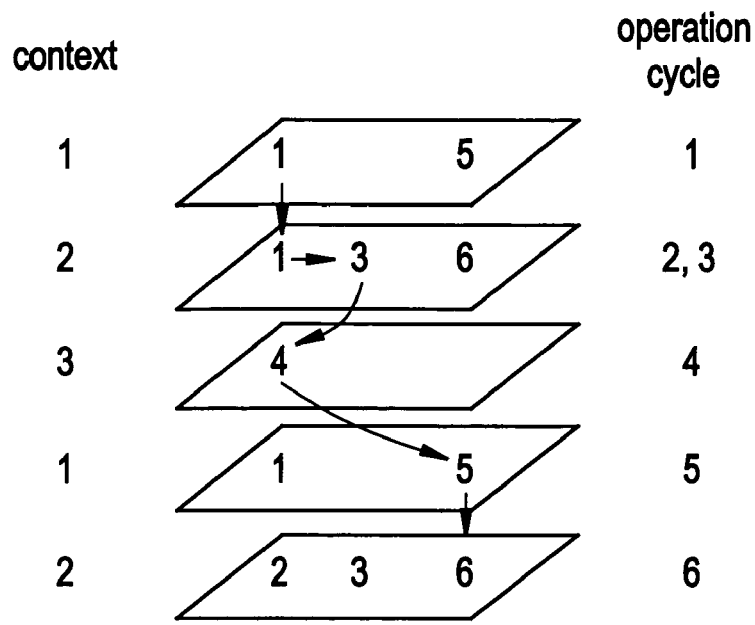
FIG. 22 is a diagram showing a plurality of non-successive operating states assigned to a single context.

The assignment of two successive operation states to one context has been described above. However, two or more operation states may be assigned to one context. As shown in FIGS. 21 and 22, a plurality of non-successive operation states may be assigned to one context. In this case, the number of times that contexts of the matrix circuit 105 are switched by the state manager 103 may not be reduced in some cases, but the number of contexts whose data is set in an object code can be reduced.

In the above embodiment, an object code generated by the data processing apparatus 300 is temporarily held in the array-type processor 100. However, the array-type processor 100 may operate on a real-time bases according to an object generated by the data processing apparatus 300.

In the above embodiment, the state manager 103 switches contexts of the matrix circuit 105 in respective operation cycles according to an object code temporarily stored in the code memory 102. However, the matrix circuit 105 may store a plurality of contexts and perform a corresponding process in each operation cycle.

At this time, the state manager 103 can update all of plural contexts stored in the matrix circuit 105 in respective cycles. However, while the matrix circuit 105 is performing a corresponding process in one of a given number of contexts stored in the matrix circuit 105, the state manager 103 may update the context in which the corresponding process has been performed, into a new context. In this case, the matrix circuit 105 holds only a given number of contexts, but can successively perform corresponding processes in the contexts without being limited by the number of contexts.

Figure 23:
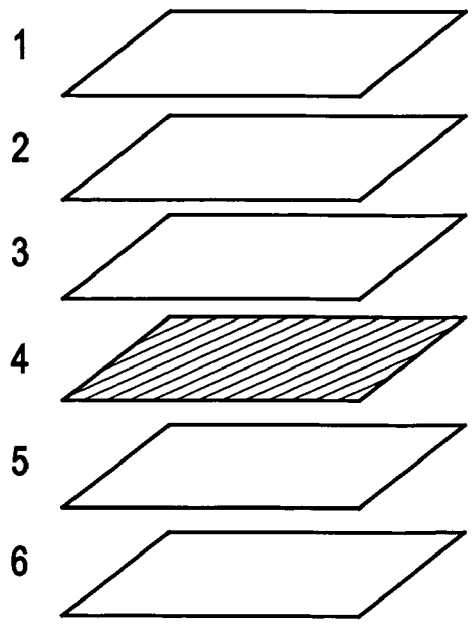
FIG. 23 is a diagram showing a plurality of successive contexts, one of which is active.
Figure 24:
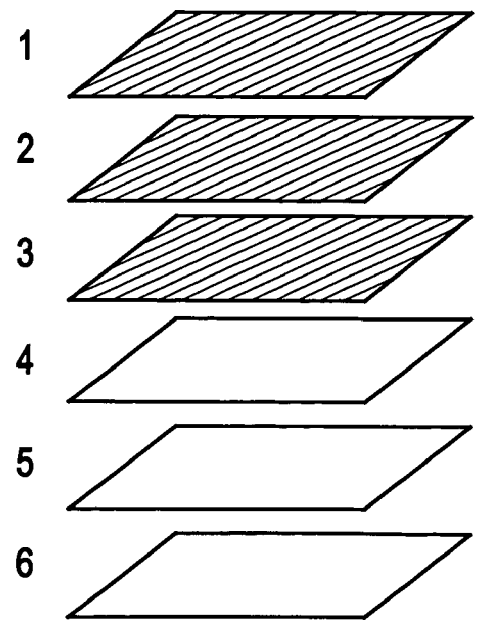
FIG. 24 is a diagram showing a plurality of successive contexts which are active.

For example, as shown in FIG. 23, when the matrix circuit 105 holds first trough sixth contexts and performs data processing processes successively therefor, while the matrix circuit 105 is performing the data processing process in the fourth context, the state manager 103 can update the first through third contexts for which the data processing processes are finished.

However, since one context may be used repeatedly in a plurality of operation cycles as shown in FIG. 22, the state manager 103 can update the fourth and fifth contexts for which the data processing processes are finished, if the matrix circuit 105 has successively performed data processing processes on the held data in the first through sixth contexts and then performs again data processing processes in the first through third contexts.

In order to have the array-type processor 100 operate in the above fashion, the data processing apparatus 300 may generate a CDFG in order for the state manager 103 to update the context for which the corresponding process has been performed into a new context while the matrix circuit 150 is performing the corresponding process in one of a given number of contexts whose data have been stored. Then, the array-type processor 100 can perform the above process according to an object code generated from the CDFG.

In the above embodiment, the CPU 301 operates according to the computer program stored in the RAM 304 or the like to allow the various means to be logically implemented as the various functions of the data processing apparatus 300. However, each of the various means may be constructed as inherent hardware, or some of the various means may be stored as software in the RAM 304 or the like and some of them may be constructed as hardware.

While preferred embodiments of the present invention have been described in specific terms, such description is for illustrative purposes only, and it is to be understood that changes and variations may be made without departing from the spirit or scope of the following claims.

What is claimed is:

1. A data processing apparatus for generating an object code from a source code descriptive of operation of a parallel operation apparatus having a matrix of processing circuits for individually carrying out data processing according to individually established operation instructions, and interconnection circuits for individually switching connections between said processing circuits according to said individually established operation instructions, said object code containing at least contexts composed of said individually established operation instructions for sequentially switched operation cycles of said processing circuits and said interconnection circuits, said data processing apparatus comprising:
   condition storage means for registering, in advance, limiting conditions representing at least a physical structure and physical characteristics of said parallel operation apparatus;
   source input means for entering said source code;
   object generating means for detecting operation states in successively transited stages corresponding to said contexts in the sequentially switched operation cycles from said source code entered by said source input means according to said limiting conditions, and generating said object code; and
   object output means for outputting said object code generated by said object generating means.

2. A data processing apparatus according to claim 1, wherein said parallel operation apparatus comprises a matrix circuit having said matrix of processing circuits and interconnection circuits, and a state manager, separate from said matrix circuit, for sequentially switching the contexts of said matrix circuit in the operation cycles, respectively;
   said object generating means comprising means for separating a data path corresponding to said matrix circuit and a finite-state machine corresponding to said state manager from each other when said object code is generated from said source code according to said limiting conditions.

3. A data processing apparatus according to claim 2, wherein said object generating means comprises:
   graph generating means for analyzing a language of said source code and generating a Data Flow Graph (DFG); and
   schedule generating means for generating a Control Data Flow Graph (CDFG) in which said operation states sequentially transited in a plurality of stages are scheduled, from the DFG generated by said graph generating means according to said limiting conditions.

4. A data processing apparatus according to claim 1, wherein said object generating means comprises:
   graph generating means for analyzing a language of said source code and generating a Data Flow Graph (DFG); and
   schedule generating means for generating a Control Data Flow Graph (CDFG) in which said operation states sequentially transited in a plurality of stages are scheduled, from the DFG generated by said graph generating means according to said limiting conditions.

5. A data processing apparatus according to claim 4, wherein said condition storage means comprises means for registering, as said limiting conditions, a predetermined threshold value corresponding to at least a number of said processing circuits;
   wherein said graph generating means comprises means for generating said DFG in which a plurality of data processing are associated with each other based on a cause-and-effect relationship, from said source code; and
   wherein said schedule generating means comprises means for scheduling data processing processes of said DFG for said operation states in a plurality of stages in a sequence corresponding to said cause-and-effect relationship, and shifting the operation states to a next stage each time a number of the scheduled data processing processes exceeds said predetermined threshold value.

6. A data processing apparatus according to claim 5, wherein said condition storage means comprises means for registering, as said limiting conditions, a bit number of processing data of said processing circuits;
   said graph generating means comprising means for generating said DFG in which the bit number of the processing data is set in the data processing, from said source code; and
   said schedule generating means comprising means for calculating a number of processing circuits to be used in said data processing processes scheduled for the operation states, respectively, according to said bit number, and subtracting the calculated number from said predetermined threshold value.

7. A data processing apparatus according to claim 4, wherein said condition storage means comprises means for registering, as said limiting conditions, delay times of said processing circuits and said interconnection circuits and a time required by said operation cycles;
   said schedule generating means comprising means for scheduling the data processing of said DFG in said operation states in a plurality of stages in a sequence corresponding to a cause-and-effect relationship, and shifting the operation states to a next stage each time an accumulated value of said delay times of said processing circuits and said interconnection circuits used in the scheduled data processing exceeds said time required by said operation cycles.

8. A data processing apparatus according to claim 4, wherein said parallel operation apparatus comprises a matrix circuit having said matrix of processing circuits and interconnection circuits, for storing said contexts of said object code up to a predetermined number and sequentially performing corresponding processes, and a state manager, separate from said matrix circuit, for updating the context for which a corresponding process has been executed into a new context while said matrix circuit is performing the corresponding process in one of said predetermined number of contexts stored in said matrix circuit;
   said schedule generating means comprising means for generating said CDFG in order for said state manager to update the context for which a corresponding process has been executed into a new context while said matrix circuit is performing the corresponding process in one of said predetermined number of contexts stored in said matrix circuit.

9. A data processing apparatus according to claim 4, wherein said parallel operation apparatus comprises a matrix circuit having said matrix of processing circuits and interconnection circuits, and a state manager, separate from said matrix circuit, for sequentially switching the contexts of said matrix circuit in the operation cycles, respectively, and description generating means for generating an RTL (Register Transfer Level) description in the operation states in a plurality of stages, separately for said matrix circuit and said state manager, from said CDFG generated by said schedule generating means according to said limiting conditions.

10. A data processing apparatus according to claim 9, wherein said object generating means comprises list generating means for generating net lists of said processing circuits in the respective operation states in a plurality of stages from the RTL description of said matrix circuit generated by said description generating means according to said limiting conditions.

11. A data processing apparatus according to claim 9, wherein each of said processing circuits of said parallel operation apparatus comprises a plurality of types of circuit resources for which processing data have different bit numbers; and
   said object generating means comprising list generating means for generating net lists of said plurality of types of circuit resources of said processing circuits in the respective operation states in a plurality of stages from the RTL description of said matrix circuit generated by said description generating means according to said limiting conditions.

12. A data processing apparatus according to claim 11, wherein said parallel operation apparatus comprises a matrix circuit having said matrix of processing circuits and interconnection circuits, and a state manager, separate from said matrix circuit, for sequentially switching contexts of said matrix circuit in operation cycles, respectively, data processing apparatus further comprising:
   object storage means for registering, in advance, various object codes of said state manager which correspond to the operation states in a plurality of stages;
   state converting means for converting the RTL description of said state manager generated by said description generating means into the corresponding object codes according to the net lists of said matrix circuit which have been generated by said list generating means; and
   object output means for outputting the object codes of said state manager which have been converted by said state converting means.

13. A parallel operation apparatus having a matrix of processing circuits for individually carrying out data processing according to individually established operation instructions, said parallel operation apparatus being operable according to an object code stored in code storage means, said object code being generated by a data processing apparatus according to claim 12.

14. A parallel operation apparatus having a matrix of processing circuits for individually carrying out data processing according to individually established operation instructions, said parallel operation apparatus being operable according to an object code entered from an external source into an object input means, said object code being generated by a data processing apparatus according to claim 12.

15. A data processing system comprising:
   a data processing apparatus according to claim 12; and
   a parallel operation apparatus having a matrix of processing circuits for individually carrying out data processing according to individually established operation instructions, said parallel operation apparatus being operable according to an object code entered from an external source into an object input means, said object code being generated by said data processing apparatus.

16. A data processing apparatus according to claim 11, wherein each of said processing circuits of said parallel operation apparatus comprises mb circuit resources for which processing data comprises mb(m-(bit)) data where "m" represents a natural number of "2" or greater and nb circuit resources for which processing data comprises nb(n-(bit)) data where "n" represents a natural number smaller than "m"; and
   said list generating means comprising means for generating net lists of m/nb circuit resources of said processing circuits from said RTL description according to said limiting conditions.

17. A data processing apparatus according to claim 16, wherein said list generating means comprises means for assigning "xb(x-(bit))" data processing, where "x" is a natural number greater than "m", of said RTL description to Y mb circuit resources and Z nb circuit resources where:
   x=Ym+Zn ("Y" and "Z" are a natural number).

18. A data processing apparatus according to claim 17, wherein said list generating means comprises means for calculating an integer "Y" of a result produced by dividing "x" by "m", and calculating an integer "Z" of a result produced by dividing a remainder by "n".

19. A data processing apparatus according to claim 18, wherein said list generating means comprises means for calculating said integer "Z" if said remainder is smaller than a predetermined threshold value, and adding "1" to "Y" to make "Z=0" if said remainder is equal to or greater than said predetermined threshold value.

20. A data processing apparatus according to claim 17, wherein "nb" of said limiting conditions registered in said condition storage means comprises "1 (bit)".

21. A data processing apparatus according to claim 11, further comprising:
   object storage means which comprises a means for registering, in advance, various object codes of said processing circuits;
   processing layout means for assigning said net lists generated by said list generating means to said processing circuits of said matrix circuit in the respective contexts in a plurality of cycles according to said limiting conditions; and
   code converting means for converting the net lists assigned to said processing circuits by said processing layout means into corresponding object codes.

22. A data processing apparatus according to claim 21, said object storage means comprises means for registering, in advance, various object codes of said interconnection circuits, further comprising:
   interconnection converting means for converting said net lists of said interconnection circuits into object codes according to the object codes of said processing circuits which have been converted by said code converting means.

23. A data processing apparatus according to claim 22, wherein each of said processing circuits has a register file for temporarily holding processing data;
   said processing layout means comprising means for commonly assigning said net lists associated with said processing data in the respective contexts in a plurality of successive cycles to said register files in a given position in said matrix circuit.

24. A data processing apparatus according to claim 23, wherein said processing layout means comprises means for first assigning said net lists to said register files irrespective of the association of said processing data in respective contexts in a plurality of cycles, and then adjusting assigned positions to align the positions of said register files to which said net lists associated with said processing data are assigned, in the contexts in a plurality of consecutive cycles.

25. A data processing apparatus according to claim 23, wherein said processing layout means comprises means for first fixing positions in said matrix circuit of said register files to which said net lists associated with said processing data are commonly assigned in the respective contexts in a plurality of cycles, and then assigning other net lists to other register files in the respective contexts in a plurality of cycles.

26. A data processing apparatus according to claim 23, wherein said processing layout means comprises means for first setting the relative positions in said matrix circuit of said register files to which said net lists associated with said processing data are commonly assigned in the respective contexts in a plurality of cycles, and then assigning other net lists to other register files in the respective contexts in a plurality of cycles while maintaining the relative positions.

27. A data processing apparatus according to claim 1, further comprising:
   state detecting means for detecting a plurality of operation states to be assigned to one of the contexts from said operation states in a plurality of successively transited stages according to said limiting conditions; and
   state combining means for assigning the operation states detected by said state detecting means to one of said contexts.

28. A data processing apparatus according to claim 27, wherein said state detecting means comprises means for detecting a plurality of operation states in successive transition stages.

29. A parallel operation apparatus having a matrix of processing circuits for individually carrying out data processing according to individually established operation instructions, said parallel operation apparatus being operable according to an object code stored in code storage means, said object code being generated by a data processing apparatus according to claim 1.

30. A parallel operation apparatus having a matrix of processing circuits for individually carrying out data processing according to individually established operation instructions, said parallel operation apparatus being operable according to an object code entered from an external source into an object input means, said object code being generated by a data processing apparatus according to claim 1.

31. A data processing system comprising:
   a data processing apparatus according to claim 1; and
   a parallel operation apparatus having a matrix of processing circuits for individually carrying out data processing according to individually established operation instructions, said parallel operation apparatus being operable according to an object code entered from an external source into an object input means, said object code being generated by said data processing apparatus.

32. A data processing apparatus for generating a Control Data Flow Graph (CDFG), from a source code, of a parallel operation apparatus having a matrix of processing circuits for individually carrying out data processing according to individually established operation instructions, and interconnection circuits for individually switching connections between said processing circuits according to individually established operation instructions, said data processing apparatus comprising:
   condition storage means for registering, in advance, limiting conditions representing at least a physical structure and physical characteristics of said parallel operation apparatus;
   source input means for entering said source code;
   graph generating means for analyzing the language of said source code entered by said source input means and generating a Data Flow Graph (DFG); and
   schedule generating means for generating a CDFG in which operation states sequentially transited in a plurality of stages are scheduled, from the DFG generated by said graph generating means according to said limiting conditions.

33. A data processing apparatus according to claim 32, wherein said condition storage means comprises means for registering, as said limiting conditions, a predetermined threshold value corresponding to at least a number of said processing circuits;
   said graph generating means comprising means for generating said DFG in which a plurality of data processing are associated with each other based on a cause-and-effect relationship, from said source code; and
   said schedule generating means comprising means for scheduling data processing processes of said DFG in said operation states in a plurality of stages in a sequence corresponding to said cause-and-effect relationship, and shifting the operation states to a next stage each time a number of the scheduled data processing processes exceeds said predetermined threshold value.

34. A data processing apparatus according to claim 32, wherein said condition storage means comprises means for registering, as said limiting conditions, delay times of said processing circuits and said interconnection circuits and a time required by said operation cycles;
said schedule generating means comprising means for scheduling the data processing of said DFG in said operation states in a plurality of stages in a sequence corresponding to a cause-and-effect relationship, and shifting the operation states to a next stage each time an accumulated value of said delay times of said processing circuits and said interconnection circuits used in the scheduled data processing exceeds said time required by operation cycles.

35. A data processing apparatus according to claim 32, further comprising:
state detecting means for detecting a plurality of operation states to be assigned to one of the contexts from said operation states in a plurality of successively transited stages according to said limiting conditions; and
state combining means for assigning the operation states detected by said state detecting means to one of said contexts.

36. A data processing apparatus for generating net lists of circuit resources from a Register Transfer Level (RTL) description of a parallel operation apparatus having a matrix of processing circuits each having a plurality of types of circuit resources for which processing data have different bit numbers, for individually carrying out data processing according to individually established operation instructions, and interconnection circuits for individually switching connections between said processing circuits according to individually established operation instructions, said data processing apparatus comprising:
condition storage means for registering, in advance, limiting conditions representing at least a physical structure and physical characteristics of said parallel operation apparatus;
description input means for entering the RTL description of said parallel operation apparatus;
list generating means for generating net lists of the plurality of types of circuit resources from said RTL description entered by said description input means according to said limiting conditions; and
list output means for outputting said net lists generated by said list generating means.

37. A data processing apparatus according to claim 36, wherein said parallel operation apparatus comprises a matrix circuit having said matrix of processing circuits and interconnection circuits, and a state manager, separate from said matrix circuit, for sequentially switching contexts of said matrix circuit in operation cycles, respectively, data processing apparatus further comprising:
object storage means for registering, in advance, various object codes of said state manager which correspond to the operation states in a plurality of stages;
state converting means for converting the RTL description of said state manager generated by a description generating means into corresponding object codes according to the net lists of said matrix circuit which have been generated by said list generating means; and
object output means for outputting the object codes of said state manager which have been converted by said state converting means.

38. A data processing apparatus according to claim 36, wherein each of said processing circuits of said parallel operation apparatus comprises mb circuit resources for which processing data comprises mb(m-(bit)) data where "m" represents a natural number of "2" or greater and nb circuit resources for which processing data comprises nb(n-(bit)) data where "n" represents a natural number smaller than "m"; and
said list generating means comprising means for generating net lists of m/nb circuit resources of said processing circuits from said RTL description according to said limiting conditions.

39. A data processing apparatus according to claim 36, further comprising:
object storage means which comprises means for registering, in advance, various object codes of said processing circuits;
processing layout means for assigning said net lists generated by said list generating means to said processing circuits of a matrix circuit in respective contexts in a plurality of cycles according to said limiting conditions; and
code converting means for converting the net lists assigned to said processing circuits by said processing layout means into corresponding object codes.

40. A data processing apparatus according to claim 36, further comprising:
state detecting means for detecting a plurality of operation states to be assigned to one of the contexts from said operation states in a plurality of successively transited stages according to said limiting conditions; and
state combining means for assigning the operation states detected by said state detecting means to one of said contexts.

41. A data processing apparatus for generating object codes in respective contexts in a plurality of sequentially switched cycles from net lists of a matrix circuit of a parallel operation apparatus having a matrix of processing circuits for individually carrying out data processing according to individually established operation instructions, and interconnection circuits for individually switching connections between said processing circuits according to individually established operation instructions, said data processing apparatus comprising:
condition storage means for registering, in advance, limiting conditions representing at least a physical structure and physical characteristics of said parallel operation apparatus;
object storage means for registering, in advance, the object codes of said processing circuits;
processing layout means for assigning said net lists to said processing circuits of said matrix circuit in the respective contexts in a plurality of cycles according to said limiting conditions;
code converting means for converting the net lists assigned to said processing circuits by said processing layout means into corresponding object codes; and
object output means for outputting the object codes of said processing circuits which have been converted by said code converting means.

42. A data processing apparatus according to claim 41, said object storage means comprises means for registering, in advance, various object codes of said interconnection circuits, further comprising:
interconnection converting means for converting said net lists of said interconnection circuits into object codes according to the object codes of said processing circuits which have been converted by said code converting means.

43. A data processing apparatus according to claim 41, further comprising:
state detecting means for detecting a plurality of operation states to be assigned to one of the contexts from said operation states in a plurality of successively transited stages according to said limiting conditions; and
state combining means for assigning the operation states detected by said state detecting means to one of said contexts.

44. A parallel operation apparatus having a matrix of processing circuits for individually carrying out data processing according to individually established operation instructions, said parallel operation apparatus being operable according to an object code stored in code storage means, said object code being generated by a data processing apparatus according to claim 41.

45. A parallel operation apparatus having a matrix of processing circuits for individually carrying out data processing according to individually established operation instructions, said parallel operation apparatus being operable according to an object code entered from an external source into an object input means, said object code being generated by a data processing apparatus according to claim 41.

46. A data processing system comprising:
a data processing apparatus according to claim 41; and
a parallel operation apparatus having a matrix of processing circuits for individually carrying out data processing according to individually established operation instructions, said parallel operation apparatus being operable according to an object code entered from an external source into an object input means, said object code being generated by said data processing apparatus.

47. A method of processing data in a data processing apparatus for generating an object code from a source code descriptive of operation of a parallel operation apparatus having a matrix of processing circuits for individually carrying out data processing according to individually established operation instructions, and interconnection circuits for individually switching connections between said processing circuits according to individually established operation instructions, said object code containing at least contexts composed of said individually established operation instructions for sequentially switched operation cycles of said processing circuits and said interconnection circuits, said method comprising the steps of:
receiving an entry of said source code;
detecting operation states in successively transited stages corresponding to said contexts in the sequentially switched operation cycles from said source code according to limiting conditions, registered in advance, representing at least a physical structure and physical characteristics of said parallel operation apparatus, and generating said object code; and
outputting the generated object code.

48. A method of processing data in a data processing apparatus for generating a Control Data Flow Graph (CDFG), from a source code, of a parallel operation apparatus having a matrix of processing circuits for individually carrying out data processing according to individually established operation instructions, and interconnection circuits for individually switching connections between said processing circuits according to individually established operation instructions, said method comprising the steps of:
entering said source code;
analyzing a language of said source code which is entered and generating a Data Flow Graph (DFG); and
generating a CDFG in which operation states in a plurality of stages are scheduled, from the DFG which has been generated according to limiting conditions, registered in advance, representing at least a physical structure and physical characteristics of said parallel operation apparatus.

49. A method of processing data in a data processing apparatus for generating net lists of circuit resources from a Register Transfer Level (RTL) description of a parallel operation apparatus having a matrix of processing circuits each having a plurality of types of circuit resources for which processing data have different bit numbers, for individually carrying out data processing according to individually established operation instructions, and interconnection circuits for individually switching connections between said processing circuits according to individually established operation instructions, said method comprising the steps of:
entering the RTL description of said parallel operation apparatus;
generating net lists of the plurality of types of circuit resources from said RTL description according to limiting conditions, registered in advance, representing at least a physical structure and physical characteristics of said parallel operation apparatus; and
outputting said net lists which have been generated.

50. A method of processing data in a data processing apparatus for generating object codes in respective contexts in a plurality of sequentially switched cycles from net lists of a matrix circuit of a parallel operation apparatus having a matrix of processing circuits for individually carrying out data processing according to individually established operation instructions, and interconnection circuits for individually switching connections between said processing circuits according to individually established operation instructions, said method comprising the steps of:
assigning said net lists to said processing circuits of said matrix circuit in the respective contexts in a plurality of cycles according to limiting conditions, registered in advance, representing at least a physical structure and physical characteristics of said parallel operation apparatus;
selectively converting the net lists assigned to said processing circuits into various object codes which have been registered in advance; and
outputting the object codes of said processing circuits which have been converted.

51. A data processing apparatus including a computer program for a data processing apparatus for generating an object code from a source code descriptive of operation of a parallel operation apparatus having a matrix of processing circuits for individually carrying out data processing according to individually established operation instructions, and interconnection circuits for individually switching connections between said processing circuits according to individually established operation instructions, said object code containing at least contexts composed of said individually established operation instructions for sequentially switched operation cycles of said processing circuits and said interconnection circuits, said computer program enabling said data processing apparatus to carry out a process comprising the steps of:
receiving an entry of said source code;
detecting operation states in sequentially transited stages corresponding to said contexts in the sequentially switched operation cycles from said source code according to limiting conditions, registered in advance, representing at least a physical structure and physical characteristics of said parallel operation apparatus, and generating said object code; and outputting the generated object code.

52. A data processing apparatus including an information storage medium storing a computer program according to claim 51.

53. A data processing apparatus including a computer program for a data processing apparatus for generating a Control Data Flow Graph (CDFG), from a source code, of a parallel operation apparatus having a matrix of processing circuits for individually carrying out data processing according to individually established operation instructions, and interconnection circuits for individually switching connections between said processing circuits according to individually established operation instructions, said computer program enabling said data processing apparatus to carry out a process comprising the steps of:

entering said source code;

analyzing a language of said source code which is entered and generating a Data Flow Graph (DFG); and generating a CDFG in which operation states in a plurality of stages are scheduled, from the DFG which has been generated according to limiting conditions, registered in advance, representing at least a physical structure and physical characteristics of said parallel operation apparatus.

54. A data processing apparatus including an information storage medium storing a computer program according to claim 53.

55. A data processing apparatus including a computer program for a data processing apparatus for generating net lists of circuit resources from a Register Transfer Level (RTL) description of a parallel operation apparatus having a matrix of processing circuits each having a plurality of types of circuit resources for which processing data have different bit numbers, for individually carrying out data processing according to individually established operation instructions, and interconnection circuits for individually switching connections between said processing circuits according to individually established operation instructions, said computer program enabling said data processing apparatus to carry out a process comprising the steps of:

entering the RTL description of said parallel operation apparatus;

generating net lists of the plurality of types of circuit resources from said RTL description according to limiting conditions, registered in advance, representing at least a physical structure and physical characteristics of said parallel operation apparatus; and outputting said net lists which have been generated.

56. A data processing apparatus including an information storage medium storing a computer program according to claim 55.

57. A data processing apparatus including a computer program for a data processing apparatus for generating object codes in respective contexts in a plurality of sequentially switched cycles from net lists of a matrix circuit of a parallel operation apparatus having a matrix of processing circuits for individually carrying out data processing according to individually established operation instructions, and interconnection circuits for individually switching connections between said processing circuits according to individually established operation instructions, said computer program enabling said data processing apparatus to carry out a process comprising the steps of:

assigning said net lists to said processing circuits of said matrix circuit in the respective contexts in a plurality of cycles according to limiting conditions, registered in advance, representing at least a physical structure and physical characteristics of said parallel operation apparatus;

selectively converting the net lists assigned to said processing circuits into various object codes which have been registered in advance; and outputting the object codes of said processing circuits which have been converted.

58. A data processing apparatus including an information storage medium storing a computer program according to claim 57.

59. A data processing system comprising:

a parallel operation apparatus comprising a matrix circuit having a matrix of processing circuits and interconnection circuits, and a state manager, separate from said matrix circuit, for sequentially switching operation instructions for said matrix circuit sequentially in respective operation cycles; and a data processing apparatus for generating an object code separately for a data path and a finite-state machine from a source code descriptive of operation of said parallel operation apparatus;

said matrix circuit corresponding to said data path, and said state manager corresponding to said finite-state machine.

* * * * *